(12) United States Patent
Brink et al.

(10) Patent No.: US 10,037,398 B2
(45) Date of Patent: Jul. 31, 2018

(54) PATTERN DECOMPOSITION METHOD FOR WIRING PATTERNS WITH CHEMOEPITAXY BASED DIRECTED SELF ASSEMBLY

(71) Applicant: International Business Machines Corporation, Armonk, NY (US)

(72) Inventors: Markus Brink, White Plains, NY (US); Joy Cheng, Taipei (TW); Gregory S. Doerk, Great Neck, NY (US); Michael A. Guillorn, Yorktown Heights, NY (US); Kafai Lai, Poughkeepsie, NY (US); Hsinyu Tsai, Yorktown Heights, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 149 days.

(21) Appl. No.: 15/134,551

(22) Filed: Apr. 21, 2016

(65) Prior Publication Data

US 2017/0344691 A1 Nov. 30, 2017

(51) Int. Cl.
*G06F 17/50* (2006.01)
*H01L 21/027* (2006.01)

(52) U.S. Cl.
CPC ...... *G06F 17/5077* (2013.01); *H01L 21/0271* (2013.01)

(58) Field of Classification Search
USPC .................................. 716/51, 52, 53, 54, 55
See application file for complete search history.

(56) References Cited

U.S. PATENT DOCUMENTS

| 5,715,039 | A | 2/1998 | Fukuda et al. |
| 7,439,196 | B2 | 10/2008 | Kobayashi et al. |
| 7,605,081 | B2 | 10/2009 | Yang et al. |

(Continued)

FOREIGN PATENT DOCUMENTS

WO 2010029635 A1 3/2010

OTHER PUBLICATIONS

Mansky et al., "Controlling Polymer Surface Interactions with Random Copolymer Brushes," Science, 275, Mar. 7, 1997, pp. 1458-1460.

(Continued)

*Primary Examiner* — Brian Ngo
(74) *Attorney, Agent, or Firm* — Scully, Scott, Murphy & Presser, P.C.; Louis J. Percello, Esq.

(57) ABSTRACT

A chemical pattern layer including an orientation control material and a prepattern material is formed over a substrate. The chemical pattern layer includes alignment-conferring features and additional masking features. A self-assembling material is applied and self-aligned over the chemical pattern layer. The polymeric block components align to the alignment-conferring features, while the alignment is not altered by the additional masking features. A first polymeric block component is removed selective to a second polymeric block component by an etch to form second polymeric block component portions having a pattern. A composite pattern of the pattern of an etch-resistant material within the chemical pattern layer and the pattern of the second polymeric block component portions can be transferred into underlying material layers employing at least another etch.

17 Claims, 30 Drawing Sheets

(56) References Cited

U.S. PATENT DOCUMENTS

| | | |
|---|---|---|
| 7,767,099 B2 | 8/2010 | Li et al. |
| 9,107,291 B2 | 8/2015 | Cheng et al. |
| 2002/0171815 A1* | 11/2002 | Matsuyama ........ G03F 7/70308 355/55 |
| 2005/0089635 A1 | 4/2005 | Hasei |
| 2011/0147985 A1 | 6/2011 | Cheng et al. |

OTHER PUBLICATIONS

Ryu et al., "A Generalized Approach to Modification of Solid Surfaces", Science, 308, Apr. 8, 2005, pp. 236-239.

Bang et al., "Facile Routes to Patterned Surface Neutralization Layers for Block Copolymer Lithography," Advanced Materials, vol. 19, 2007, pp. 4552-4557.

Han et al., "Photopatternable Imaging Layers for Controlling Block Copolymer Microdomain Orientation," Advanced Materials, vol. 19, 2007, pp. 4448-4452.

H. Ito, "Chemical Amplification Resists for Microlithography", Adv. Polym. Sci., vol. 172, 2005, pp. 37-245, Springer-Verlag Berlin Heidelberg.

Freer et al., "Oriented Mesoporous Organosilicate Thin Films," Nano Letters, vol. 5, Aug. 2, 2005, pp. 2014-2018.

Chai et al., "Assembly of aligned linear metallic patterns on silicon," Nature Nanotechnology, vol. 2, Aug. 3, 2007 pp. 500-506.

\* cited by examiner

PATTERN DECOMPOSITION METHOD FOR WIRING PATTERNS WITH CHEMOEPITAXY BASED DIRECTED SELF ASSEMBLY

STATEMENT REGARDING FEDERALLY SPONSORED RESEARCH OR DEVELOPMENT

This invention was made with Government support under FA8650-10-C-7038 awarded by the Defense Advanced Research Projects Agency (DARPA). The Government has certain rights in this invention.

BACKGROUND

The present disclosure relates generally to nanoscale structures, and more particularly to methods for generating a template pattern for forming a wiring pattern and a cut mask to block regions from forming patterns, and structures for effecting the same.

Unidirectional wiring will likely be used in complementary metal-oxide semiconductor (CMOS) integrated circuit technology beyond the 14 nm node to facilitate the patterning of 1X metal features. Patterning solutions for sub 40 nm pitch wiring are of importance to continue CMOS scaling. While options such as Extreme Ultraviolet (EUV) lithography may possibly be an option, the use of techniques to extend 193 nm immersion (193i) lithography to the sub 40 nm pitch level is of high value.

193i combined with sidewall image transfer $2^{nd}$ decomposition (SIT2) or self aligned quadruple patterning (SAQP) can produce features below the 40 nm feature pitch. However, overlay for customizing the patterns is beyond the capabilities of conventional lithography tools.

Therefore, methods and structures are needed that extend 193i lithography to sublithographic resolution, with pattern customization achieved either in a self-aligned way or by subsequent customization with relaxed overlay requirements.

SUMMARY

The present disclosure provides a method for generating customized unidirectional line/space or wiring patterns by directed self-assembly (DSA) such that additional customization (with a cut mask) can be either avoided or executed with relaxed overlay requirements.

According to one aspect of the present disclosure, a method of patterning a material layer on a substrate, comprises the following steps. Providing a substrate with a material layer thereupon. Forming a chemical pattern layer on the material layer according to a material input pattern data, the chemical pattern layer comprising a first material and a second material, wherein one of the first material and the second material comprises an etch-resistant material, on a substrate, wherein physically exposed top surfaces of the first material and physically exposed top surfaces of the second material complementarily overlie an entirety of the substrate, wherein regions in which top surfaces of the first material are physically exposed comprise a prepattern layer, the prepattern layer comprising an alignment-conferring template pattern.

The template pattern is derived from the input pattern by the method comprising the following steps. First the underlying grating pattern of the input pattern data is obtained. Without loss of generality, the lines of the grating pattern are assumed to run parallel to the X axis. Second the input pattern data is subtracted from the grating pattern, to form a conjugate wiring pattern. Merging adjacent lines of the conjugate wiring pattern in a Y direction of the conjugate wiring pattern that are within a predetermined limit to form a merged conjugate wiring pattern. Shrinking the merged, conjugate wiring pattern in a Y axis direction by biasing it by a predetermined distance to form the cut mask pattern. Subtracting the cut mask pattern from the merged, conjugate wiring pattern to create the template pattern.

Once the template pattern is created, the method includes the steps of applying a self-assembling material over the template pattern. Inducing self-alignment of periodically arranged chemically distinct polymeric block components of the self-assembling material to the template pattern, wherein portions of the self-assembling material over the template pattern become self-aligned to the template pattern. Removing one of the polymeric block components selective to the other of the polymeric block components and the etch-resistant material by an etch process to form an etched self-assembled pattern. And transferring a pattern into the material layer by an etch process, whereby the material layer is transformed into a patterned material layer containing the transferred pattern.

In the first aspect, the method can also include the following steps. Subsequently applying the cut mask to the patterned material layer. Exposing the cut mask to an etch process. And removing a portion of the patterned material layer. Because the patterned material layer already contained partial customization of the pattern, the overlay requirements for exposing the cut mask are less stringent than in a traditional cut mask customization of a grating approach.

In a second aspect of the present disclosure, no exposure and etch of a cut mask are needed at the end of the process flow. Instead, empty spaces in the input pattern are augmented with dummy lines of finite length that fall on the same grating as the lines in the input pattern. The so obtained target pattern contains all the lines of the input pattern. The length of the horizontal breaks between lines in the input pattern and subsequently filled-in dummy lines can be tailored to specification during the decomposition of the corresponding template pattern.

This second method of patterning a material layer on a substrate includes the following steps. Providing a substrate with a material layer thereupon. Forming a chemical pattern layer of the material layer according to a material input pattern data, the chemical pattern layer comprising a first material and a second material, wherein one of the first material and the second material comprises an etch-resistant material, on a substrate, wherein physically exposed top surfaces of the first material and physically exposed top surfaces of the second material complementarily overlie an entirety of the substrate, wherein regions in which top surfaces of the first material are physically exposed comprise a prepattern layer, the prepattern layer comprising an alignment-conferring, merged template pattern.

The merged template pattern is formed by the following steps. Inputting an input pattern data. Obtaining the underlying ideal grating pattern of the (unidirectional) lines in the input pattern. Without loss of generality, the lines of the grating pattern are assumed to run parallel to the X axis. Subtracting the input pattern data from the grating pattern, to form a conjugate wiring pattern. Shrinking the lines of the conjugate wiring pattern on both line ends. This can be accomplished by biasing the conjugate wiring pattern in the X direction by a negative amount. This forms the dummy fill pattern. Subtracting the input pattern data and the dummy fill pattern from the grating pattern to form customization template data.

The customization template pattern contains the information required for customization, but it may not yet be sufficiently alignment-conferring. The subsequent steps augment the customization template pattern in order to increase the strength of the alignment conferment without affecting input pattern or the customization information already encoded in the customization template pattern. This is accomplished by removing certain dummy fill lines from the dummy fill pattern. Starting from the input pattern data, the first step merges neighboring lines on the same grating line; this can be achieved by biasing the input pattern in X (by a positive amount), then healing the pattern, and then un-biasing the pattern in X (by the same magnitude in the opposite direction). The second step subtracts this pattern from the grating pattern. The third step is to merge adjacent lines on consecutive tracks of the ideal grating, as achieved by biasing the pattern in Y (by a positive amount), then healing the pattern, and then un-biasing the pattern in Y (by the same magnitude in the opposite direction). This creates the merged Y data.

From the resulting pattern, single width lines are removed from the pattern in the fourth step, as can be achieved by a filter function. This creates the merged line width Y data without single width lines. Shifting the merged line width Y data one wire width in the Y axis direction to create shifted, merged Y data without single width lines. Subtracting the shifted, merged Y data from the merged line width Y data to form alignment-conferring template data. And combining the alignment-conferring template data with the customization template data to create the merged template data.

Once the merged template data is created, the method includes the steps of applying a self-assembling material over the merged template pattern. Inducing self-alignment of periodically arranged chemically distinct polymeric block components of the self-assembling material to the merged template pattern, wherein portions of the self-assembling material over the merged template pattern become self-aligned to the merged template pattern. Removing one of the polymeric block components selective to the other of the polymeric block components and the etch-resistant material by an etch process to form an etched self-assembled pattern. And transferring a pattern into the material layer by an etch process, whereby the material layer is transformed into a patterned material layer containing the transferred pattern.

We note that the two aspects of the present disclosure detailed herein represent the end points of a range of intermediate or hybrid versions of these two approaches. Combining these two aspects at various degrees, one can form a smaller subset of dummy fill wires and using a corresponding cut mask that may require even less stringent overlay accuracy.

In a third aspect of the present disclosure, a computer generated method of creating a template pattern comprises the following steps. Inputting an input pattern data into a computer, the computer including a non-transitory article of manufacture tangibly embodying computer readable instructions, which when implemented, cause the computer to perform the steps comprising; inputting an input pattern data, forming a grating pattern along an X axis of the input pattern data to cover all of the input pattern data, subtracting the input pattern data from the grating pattern, to form a conjugate wiring pattern, merging adjacent lines of the conjugate wiring pattern in a Y direction of the conjugate wiring pattern that are within a predetermined limit to form a merged conjugate wiring pattern and biasing the merged, conjugate wiring pattern in a Y axis direction a predetermined distance from a Y axis edge of the merged, conjugate wiring pattern to create the cut mask pattern, and subtracting the cut mask pattern from the merged conjugate wiring pattern to create the template pattern.

DETAILED DESCRIPTION

Figure 1A:
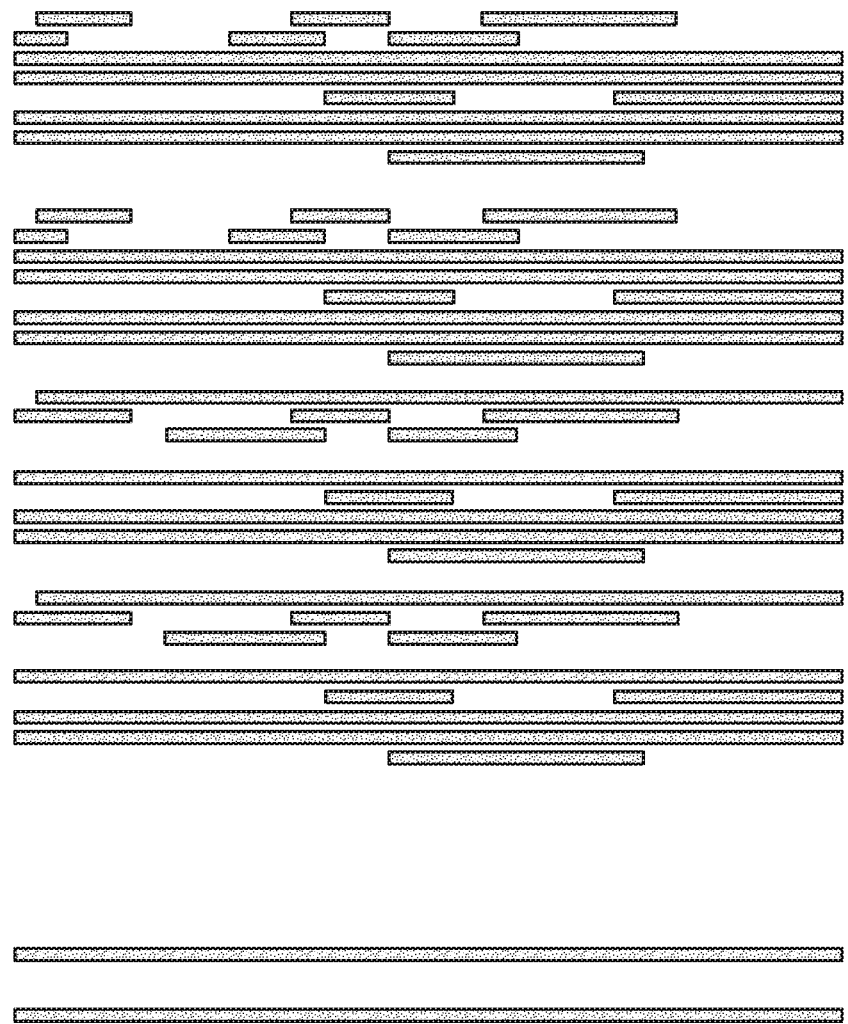
FIG. 1A is a view of a customized unidirectional line/space pattern, which serves as an input pattern according to an embodiment of the present disclosure.

The present disclosure relates to methods for patterning a material layer on a substrate, and structures for effecting the same, which are now described in detail with accompanying figures. It is noted that like and corresponding elements are referred to by like reference numerals.

The below described methods are to be used in conjunction with the chemoepitaxy etch trim using a self-aligned hard mask (CHEETAH) process. One example of the CHEETAH process may be found in U.S. Pat. No. 9,107,291, assigned to the same assignee as the present application, the entirety of which is hereby incorporated by reference.

The following figures are patterns that are produced with a modeling program, such as the BEAMER program by GenISys, the results of which are used to pattern a material layer on a substrate. This program can be performed in a program module 102, discussed further in reference to FIG. 13 below.

In an embodiment of the present disclosure, FIG. 1A is an illustration of an input line pattern, which is the wiring pattern to be produced in a material layer of a substrate. The information shown in FIG. 1A is input into the modeling program based on a desired result.

Figure 1B:
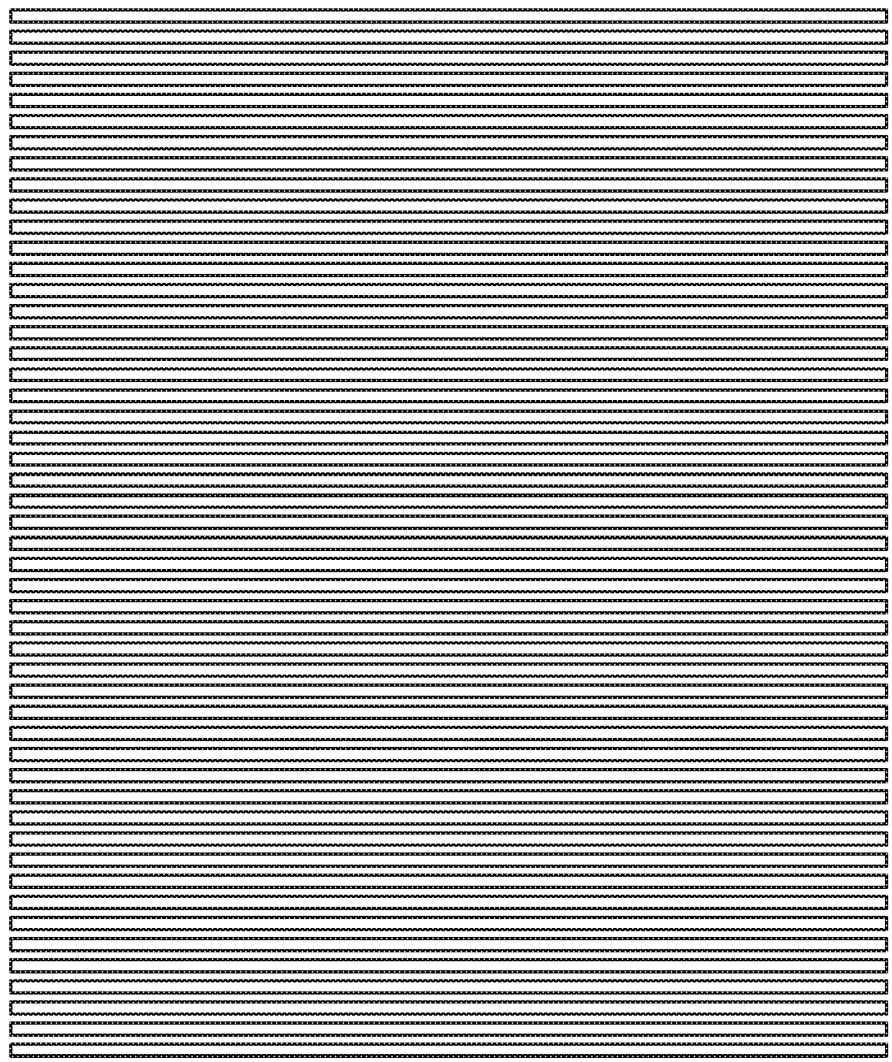
FIG. 1B is a view of a grating pattern corresponding to the input pattern in FIG. 1A, according to an embodiment of the present disclosure.

The next step, is to extend all lines in the Y axis of FIG. 1A along the length of the X axis to create a grating pattern, as shown in FIG. 1B. For areas where there is no line in the Y axis in FIG. 1A, this area is filled in by successively offsetting present lines by the pitch of a self-assembling material, discussed further below.

Figure 1C:
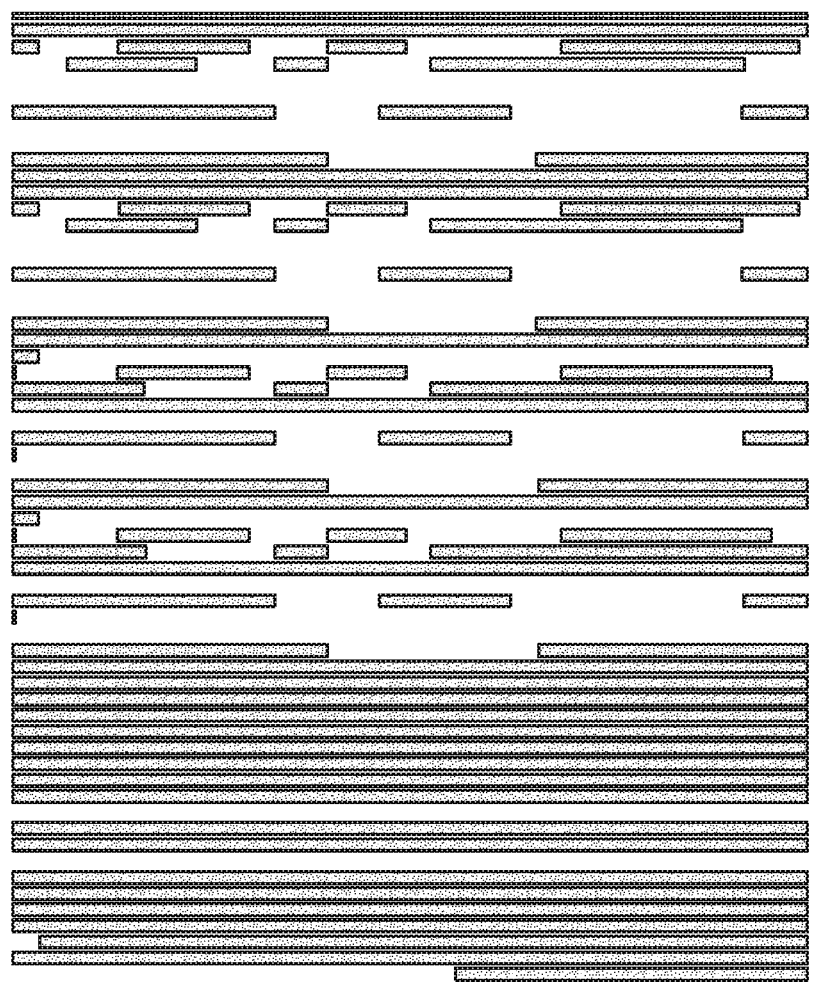
FIG. 1C is a view of the input pattern in FIG. 1A subtracted from the corresponding grating pattern in FIG. 1B.

The next step is to subtract from the grating pattern of FIG. 1B the original input line pattern of FIG. 1A, to create a pattern as shown in FIG. 1C. As can be seen in FIG. 1C when compared to FIG. 1A, FIG. 1C includes empty areas where wiring was present in FIG. 1A and filled areas where wiring was not present in FIG. 1A. This pattern is a conjugate wiring pattern.

Figure 1D:
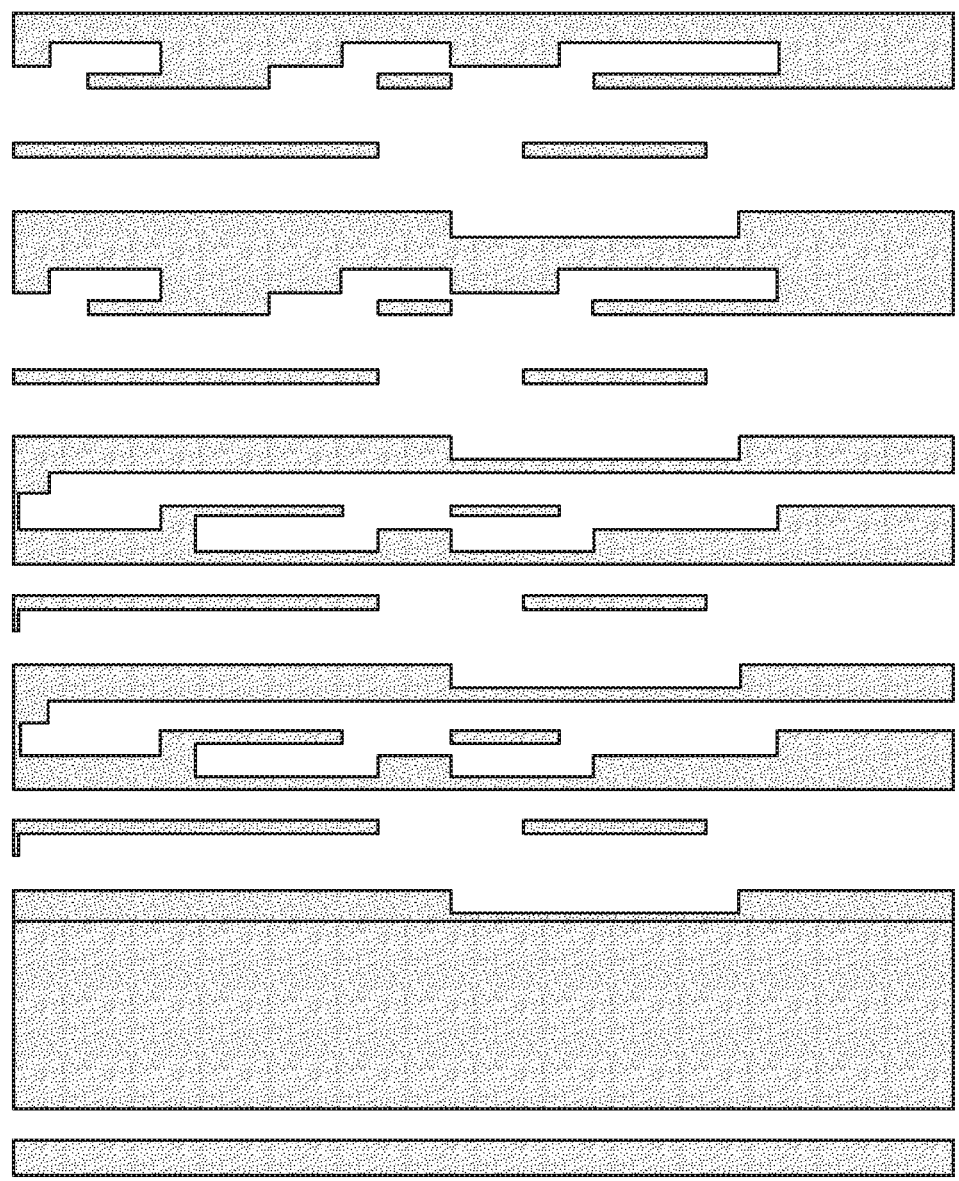
FIG. 1D is a view of a conjugate wiring pattern of the input pattern in FIG. 1A, according to an embodiment of the present disclosure.

The next step is to merge lines in FIG. 1C that are within one pitch in the Y axis of each other, to create a modified conjugate wiring pattern as shown in FIG. 1D. This modified conjugate wiring pattern is then used to form an alignment conferring template pattern and a cut mask, as described below. As an example of further explanation, the modeling program could subtract the modified conjugate wiring pattern of FIG. 1D from the grating pattern of FIG. 1B to arrive at the input line pattern of FIG. 1A.

Figure 1E:
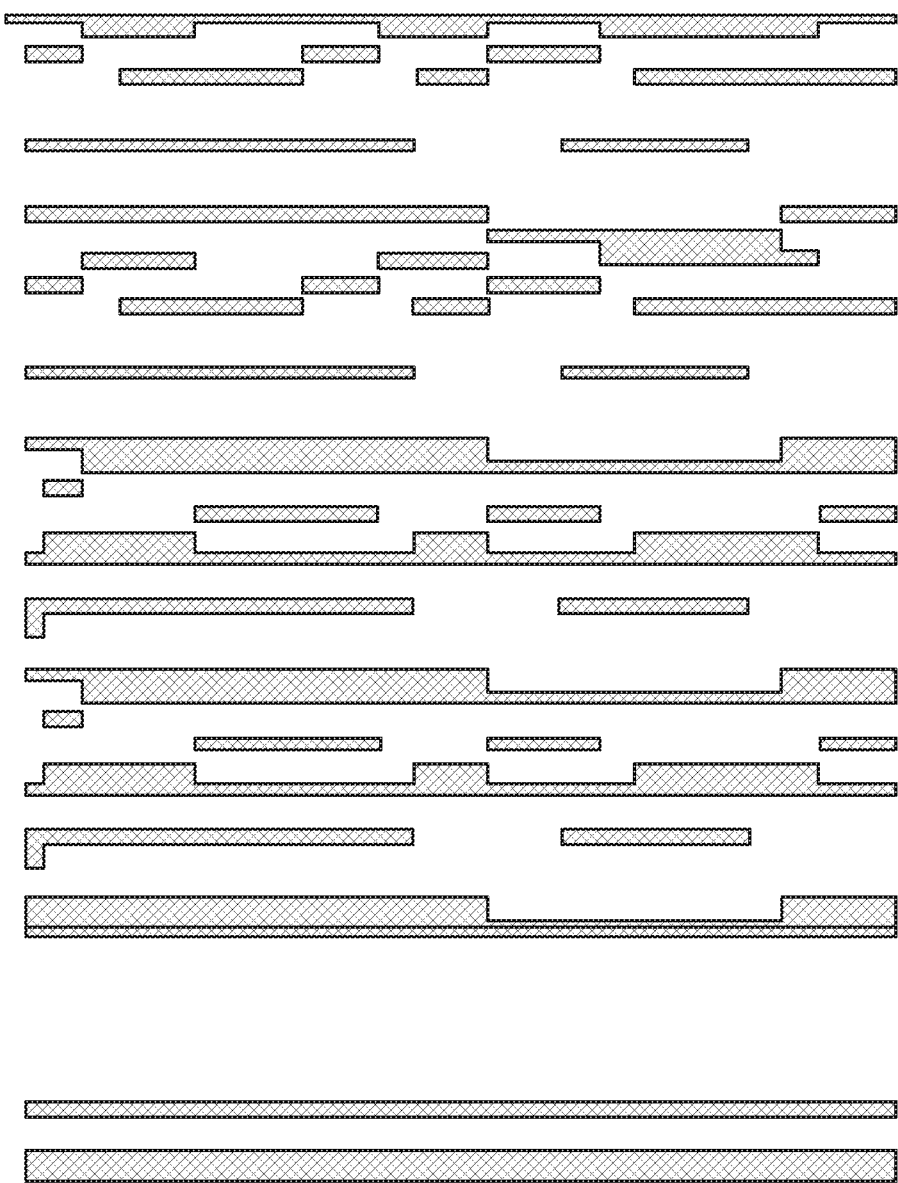
FIG. 1E is a view of a template pattern according to an embodiment of the present disclosure.

In one embodiment, a cut mask pattern is created by biasing the modified conjugate wiring pattern in the Y axis direction. The template pattern is created by subtracting the cut mask pattern from the modified conjugate wiring pattern. As shown in FIG. 1E, the template pattern includes portions of the conjugate wiring pattern that are below a certain thickness in the Y axis direction. For example, all portions of the conjugate wiring pattern below about 24 nm to about 40 nm in width in the Y axis direction can be included in the template pattern. Therefore, this biasing in the Y axis direction of the conjugate pattern creates the template pattern, each pattern line of which having a maximum width in the Y axis direction of a specified amount.

The template pattern of FIG. 1E includes all portions of the conjugate wiring pattern of FIG. 1D in contact, in the Y axis direction, with the one or more empty portions of the conjugate wiring pattern. Because of this inclusion, the template pattern is aligned with the conjugate wiring pattern.

The template pattern is alignment conferring because the template pattern is set to have a maximum width along the Y axis such that a self-assembling material, which is to be placed over the template patterns, can be sufficiently aligned with the template pattern. This sufficient alignment of the self-assembling material is a result of at least a portion of the template pattern extending along in the majority of the X axis direction.

Figure 1F:
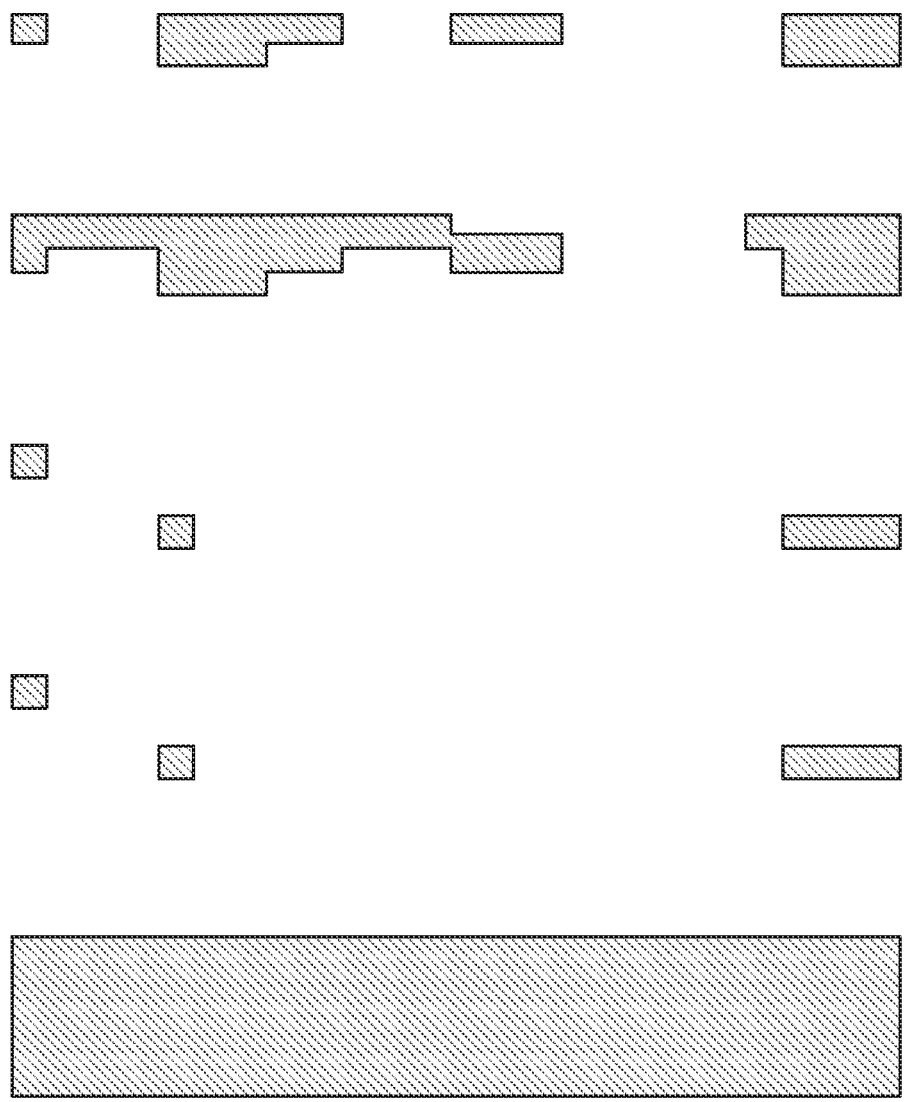
FIG. 1F is a view of a cut mask according to an embodiment of the present disclosure.

The portions of the conjugate wiring pattern that are not included in the template pattern, because the portion of the conjugate wiring pattern is above a thickness threshold in the Y axis direction, are included in a created cut mask, as shown in FIG. 1F. The cut mask pattern of FIG. 1F only includes portions of the conjugate wiring pattern that are not in contact, in the Y axis direction, with the one or more empty portions of the conjugate wiring pattern. For reference, if the template pattern of FIG. 1E and the cut mask of FIG. 1F were overlaid, they would result in the conjugate wiring pattern of FIG. 1D.

In some designs, no cut mask is created because the conjugate wiring pattern can not include any portions above a predetermined width in the Y axis direction. For example, if no portions of the conjugate wiring pattern of FIG. 1D were wider than about 40 nm in the Y axis direction, then no cut mask would be created. The cut mask can be subsequently applied to a patterned material layer, exposed to an etching procedure and used for removing exposed portions of the patterned material layer.

Since the cut mask of FIG. 1F does not contact the edge, in the Y axis direction, of the conjugate wiring pattern, the cut mask's alignment with the template pattern can be changed slightly without a loss in quality of a formed material layer of a substrate. The cut mask's alignment can be changed slightly because the cut mask would need to be misaligned by greater than the thickness of a portion of the template pattern to affect the conjugate wiring pattern.

Figure 2A:
FIG. 2A is an exemplary view of a customized unidirectional line/space pattern, which serves as an input pattern according to an embodiment of the present disclosure.
Figure 2B:
FIG. 2B is a view of a grating pattern corresponding to the input pattern in FIG. 2A, according to an embodiment of the present disclosure.

An example of the above process is shown in FIGS. 2A-2D. This example does not include an illustration of a conjugate wiring pattern. FIG. 2A is an illustration of the wiring input data is provided to the modeling program. In the next step the lines in the Y axis of FIG. 2A are extended along the length of the X axis, to create a grating pattern as shown in FIG. 2B. For areas where there is no line in the Y axis in FIG. 1A, this area is filled in by successively offsetting present lines by the pitch of a self-assembling material. The self-assembling material in this example is a directed self-assembly (DSA) material. Then the grating pattern of FIG. 2B is subtracted from the wiring input data of FIG. 2A to create a subtracted pattern (not shown). The lines within one pitch of each other in the Y axis of the subtracted pattern can be merged to create a conjugate wiring pattern (not shown).

Figure 2C:
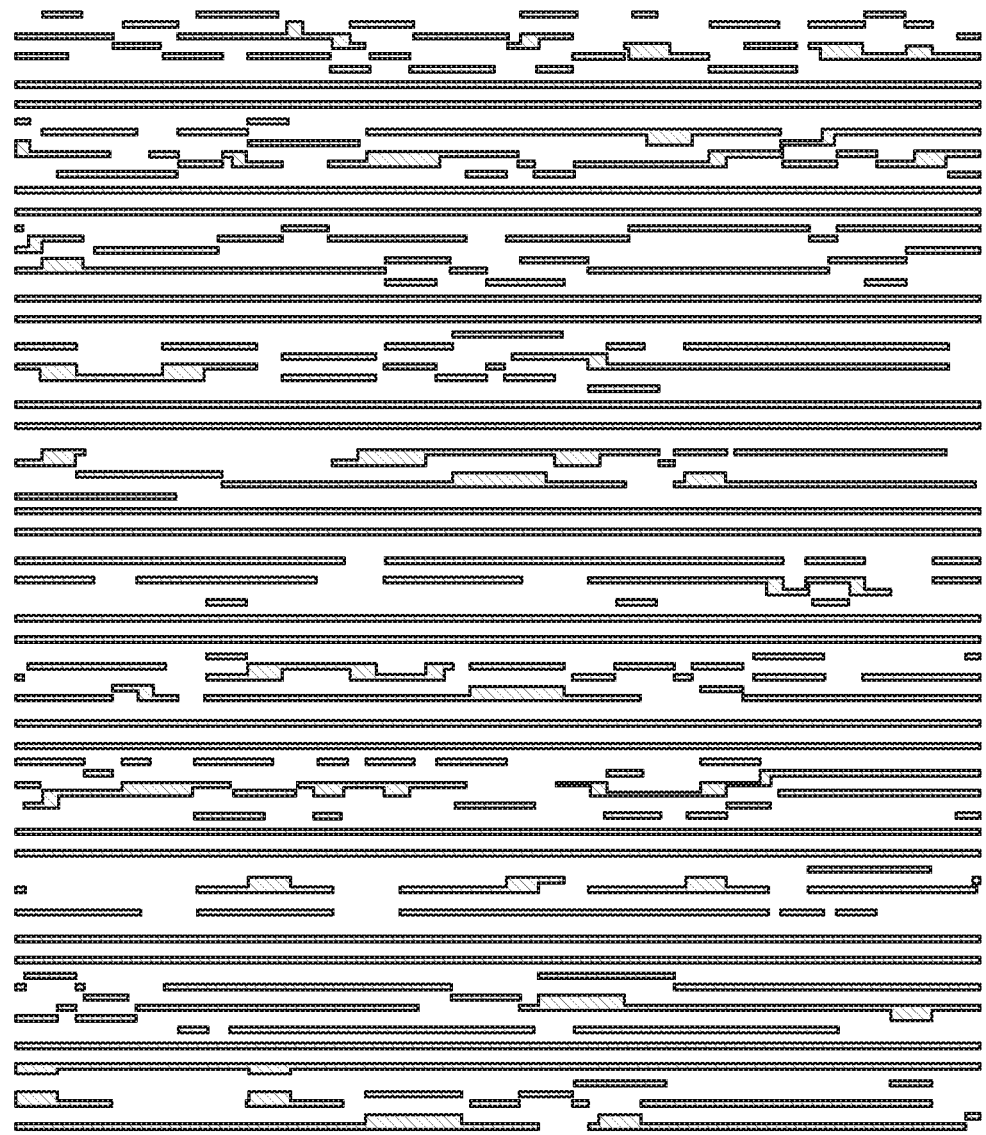
FIG. 2C is a view of an exemplary template pattern for the input pattern in FIG. 2A, according to an embodiment of the present disclosure.
Figure 2D:
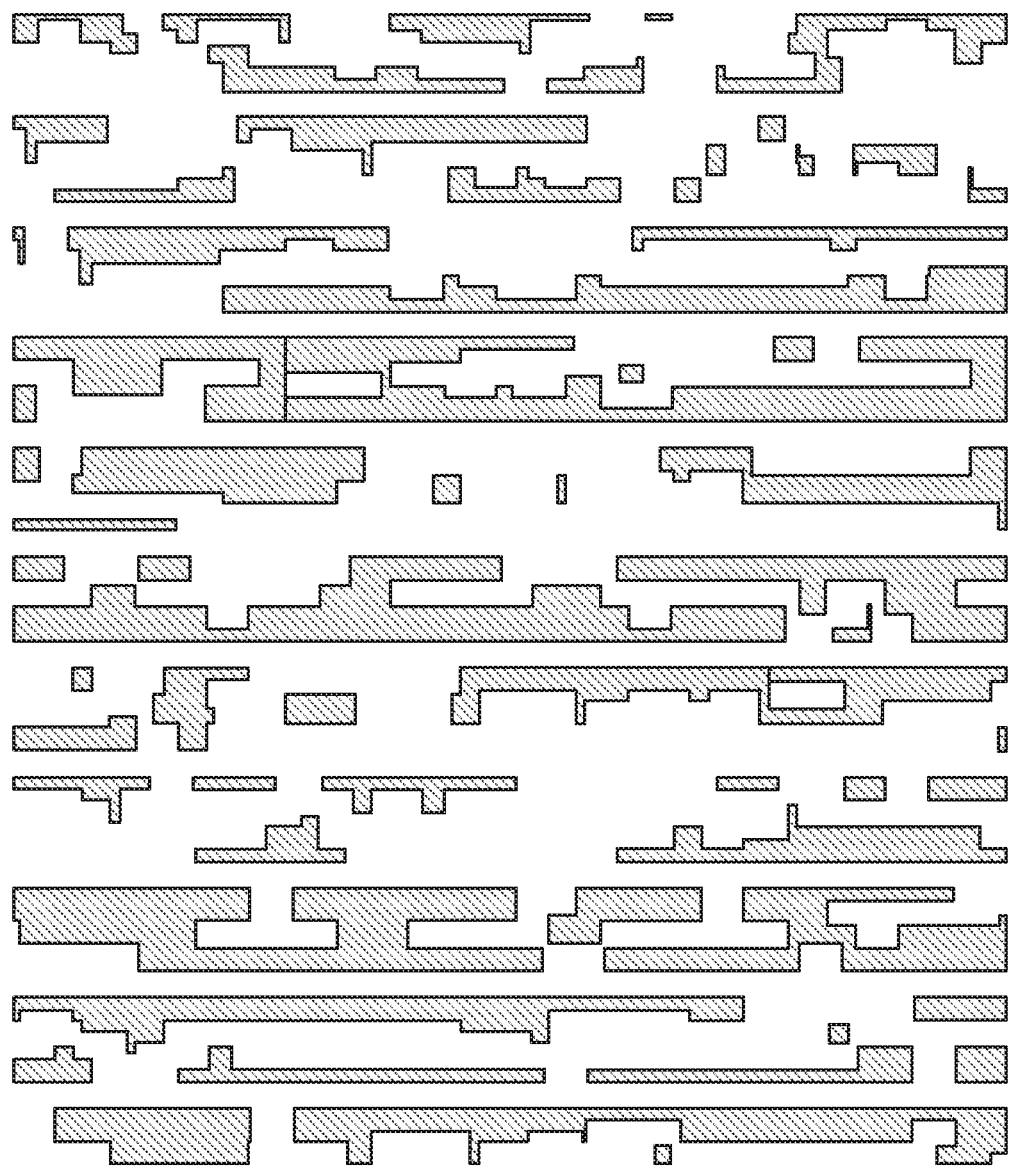
FIG. 2D is a view of a cut mask pattern corresponding to the combination of the input pattern in FIG. 2A and the template pattern in FIG. 2C, according to an embodiment of the present disclosure.

The conjugate wiring pattern is then used to create a template pattern as shown in FIG. 2C and a cut mask as shown in FIG. 2D. The template pattern of FIG. 2C includes portions of the conjugate wiring pattern that are below a certain thickness in the Y axis direction. In this example, all portions of the conjugate wiring pattern below 40 nm thick in the Y axis direction are included in the template pattern of FIG. 2C, with all portions of the conjugate wiring pattern above 40 nm thick in the Y axis direction, and not included in the template pattern of FIG. 2C, being included in the cut mask of FIG. 2D.

Figure 3A:
FIG. 3A is an exemplary view of a customized unidirectional line/space pattern, which serves as an input pattern according to an embodiment of the present disclosure.
Figure 3B:
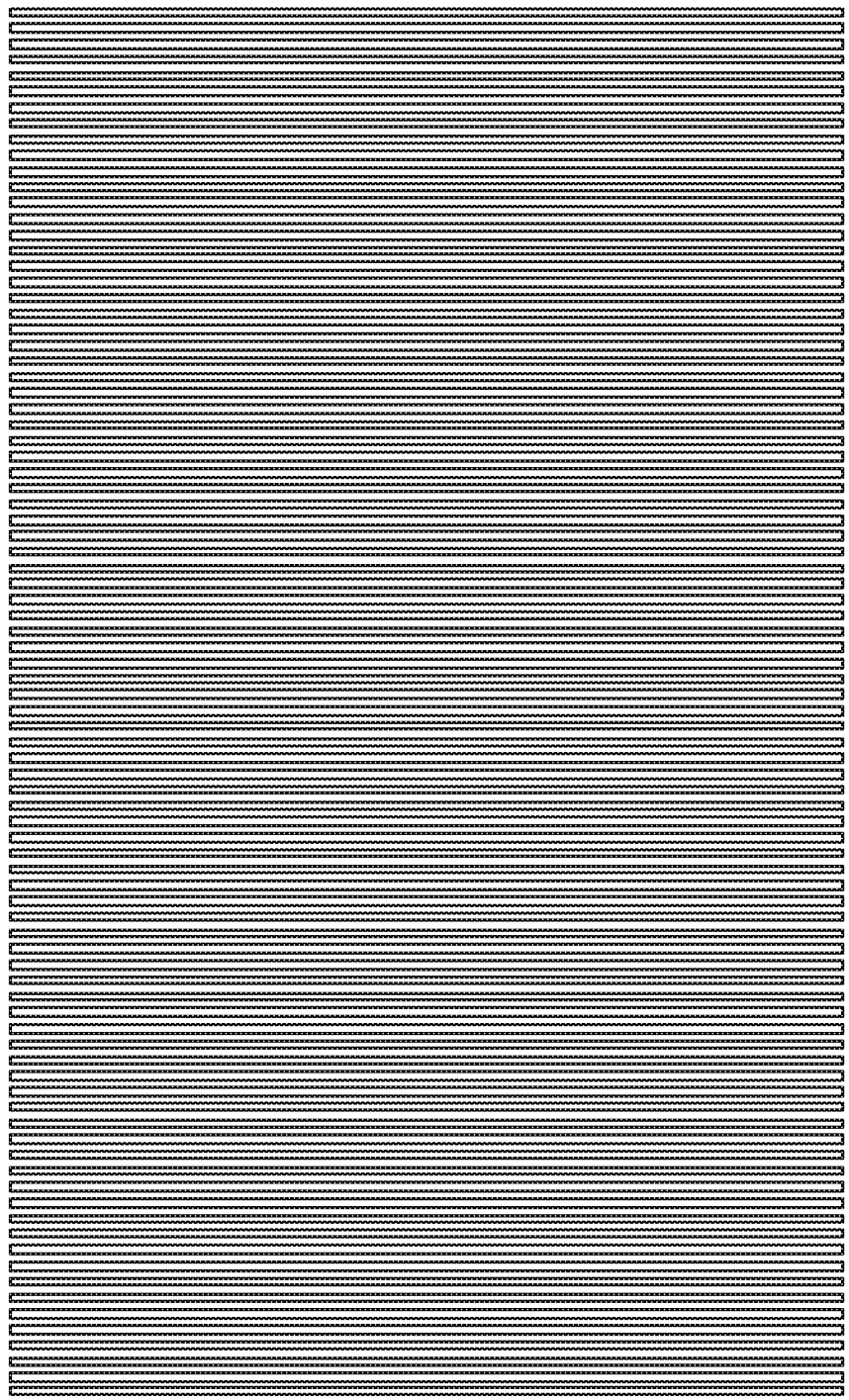
FIG. 3B is a view of a grating pattern corresponding to the input pattern in FIG. 3A, according to an embodiment of the present disclosure.
Figure 3C:
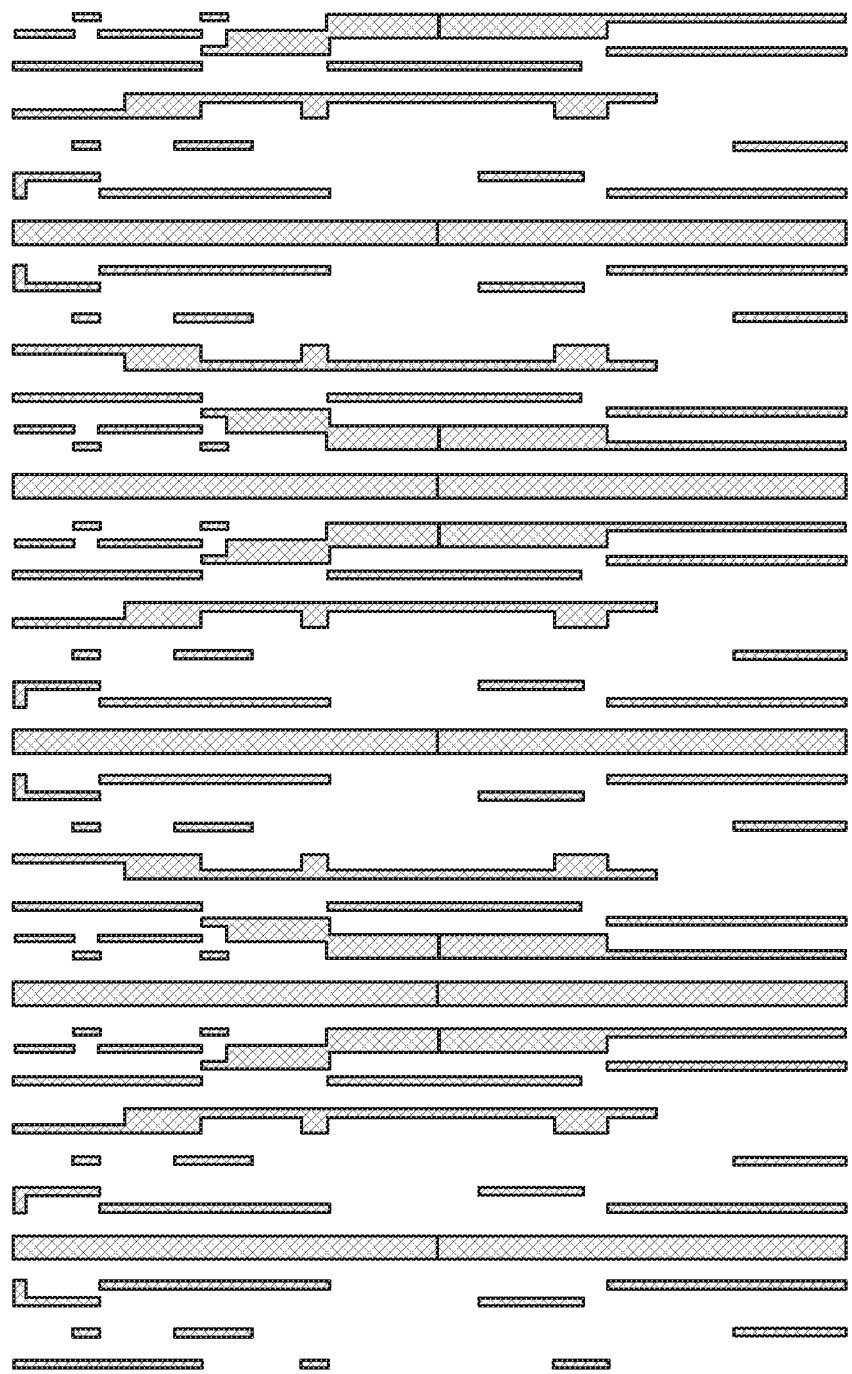
FIG. 3C is a view of an exemplary template pattern for the input pattern in FIG. 3A, according to an embodiment of the present disclosure.
Figure 3D:
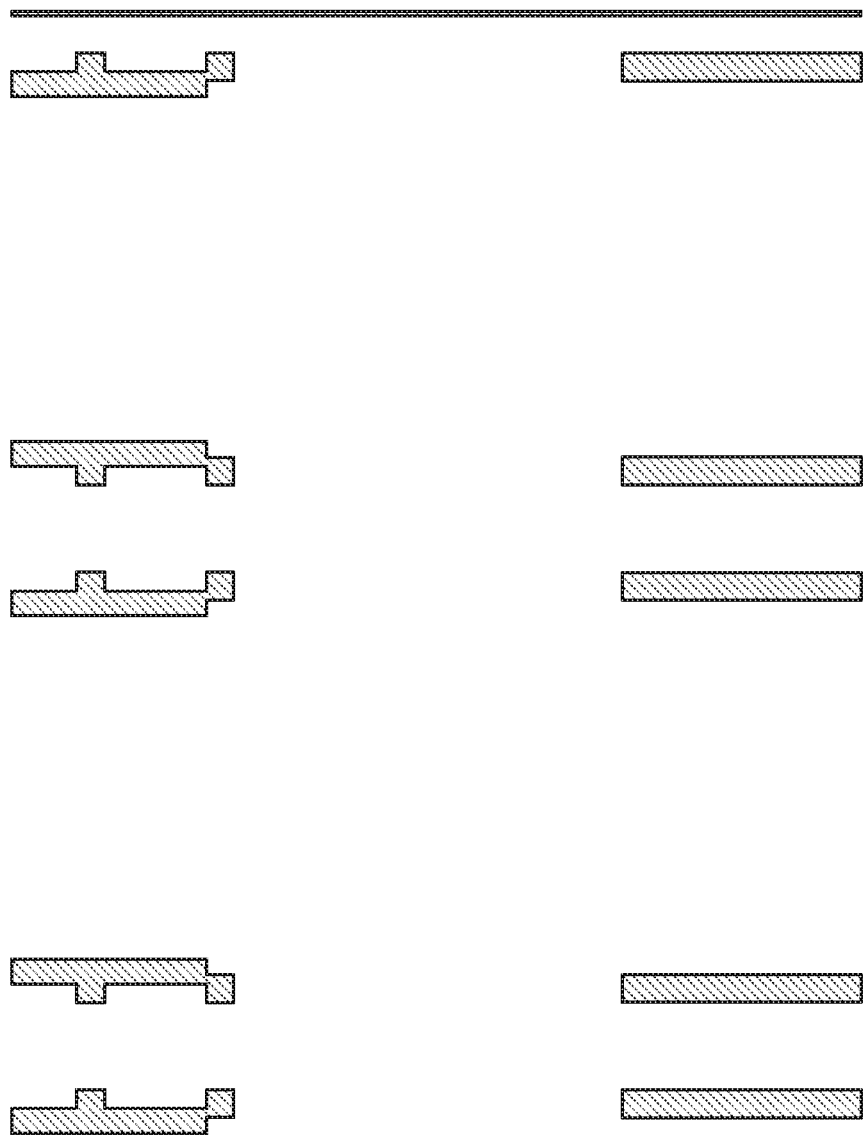
FIG. 3D is a view of a cut mask pattern corresponding to the combination of the input pattern in FIG. 3A and the template pattern in FIG. 3C, according to an embodiment of the present disclosure.

Another example of the process referred to in FIGS. 1A-1F is discussed below in reference to FIGS. 3A-3D. This example follows the same process steps as the example above, and is present to illustrate how a different wiring input data, as shown here as FIG. 3A, can affect the resultant template pattern on FIG. 3C and the resultant cut mask in FIG. 3D. Since there are many lines in FIG. 3A, and consequently few empty areas, this results in more portions in the template pattern in FIG. 3C and fewer areas included in the cut mask, shown in FIG. 3D. As with the above example, the grating patterns in FIG. 3B is illustrated as containing a DSA material.

Figure 4A:
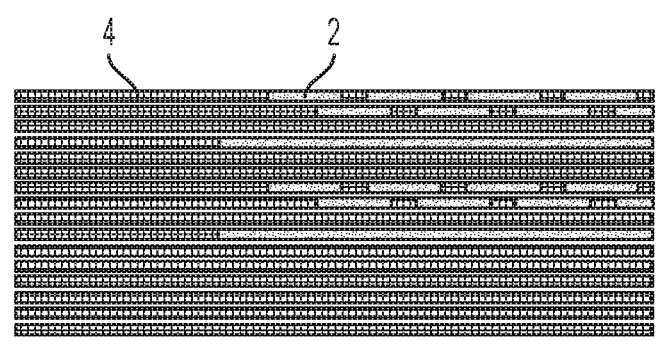
FIG. 4A is a view of input wiring data and conjugate wiring data according to an embodiment of the present disclosure.

In an embodiment of the present disclosure, as shown in FIG. 4A, the input wiring data is shown as reference number 2, with conjugate wiring data filling in the remaining portions and shown as reference number 4.

To create the image in FIG. 4A, the input wiring data 2 is initially extended in the X axis direction to create a grating pattern (not shown). For areas where there is no line in the Y axis in FIG. 4A, the area is filled in by successively offsetting present lines by the pitch of a self-assembling material, discussed further below. Once the grating pattern is complete, the wiring data 2 is subtracted from it to create the conjugate wiring data 4. FIG. 4A illustrates the conjugate wiring data 4 overlaid with the input wiring data 2, with the sum of these two patterns representing the grating pattern.

Figure 4B:
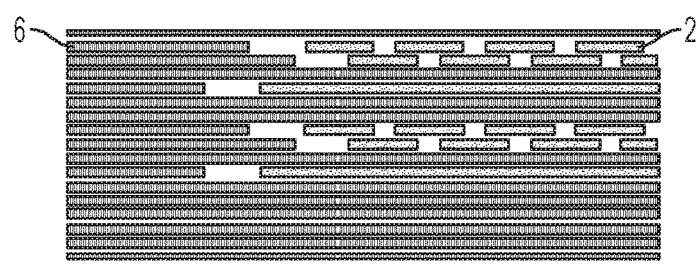
FIG. 4B is a view of input wiring data and dummy fill data according to an embodiment of the present disclosure.

The next step of this process is to bias the conjugate wiring data 4 in the X axis direction a distance away from the X axis edges of the wiring data 2. This distance can be any suitable, predetermined distance. By biasing the conjugate wiring data 4, FIG. 4B is created, which illustrates biased, conjugate wiring data 6. The biased, conjugate wiring data 6 provides the layout information for the dummy wiring pattern, which is discussed below.

The empty spaces in FIG. 4B represent the customization template pattern. It can be obtained by subtracting both the wiring data 2 and the biased conjugate wiring data 6 in FIG. 4B from the formed grating pattern. This template pattern contains the full pattern customization information from the input data.

In order to improve the alignment-conferring ability of the template pattern, select dummy wires are removed from the dummy wiring pattern and transferred to the template pattern. One particular selection process of dummy wires to be transferred to the template pattern can be accomplished with the following steps: neighboring lines on the same grating track (up to some maximum separation) of the wiring data 2 in FIG. 4B are merged in the X axis direction and subtracted from the above grating pattern. The lines in this created data are merged in the Y axis direction with other lines on adjacent tracks on the grating. Any remaining elements of one wire width or less are removed from the merged, created data. The merged, created data is then shifted one wire width in the Y axis direction and subtracted from itself.

Figure 4C:
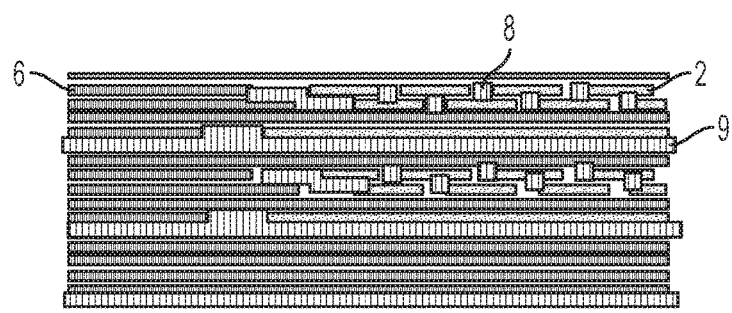
FIG. 4C is a view of input wiring data, final dummy fill data, and template data according to an embodiment of the present disclosure.

The results of this subtraction create long template lines that direct the alignment of the self-assembling material. This pattern is shown as the alignment-conferring template data 9 in FIG. 4C. The long alignment-conferring template data 9 ensures that the self-assembling material to be placed over the combined template pattern (discussed below) will sufficiently align with the combined template pattern. The customization template data 8 and the alignment-conferring template data 9 are combined to create a merged template data (consisting of elements 8 and 9 in FIG. 4C).

One of the differences between the embodiments is that one of the embodiments does not form a cut mask from template data. There are various intermediate approaches or hybrid embodiments of the two embodiments discussed herein. Combining these two aspects at various degrees, one can form a smaller subset of dummy fill wires and using a corresponding cut mask that may require even less stringent overlay accuracy.

The embodiment without a cut mask is further explained in reference to FIGS. 5A-5D, discussed below.

Figure 5A:
FIG. 5A is an exemplary view of an input line pattern according to an embodiment of the present disclosure.

FIG. 5A illustrates input wiring data. The input wiring data is then extended in the X axis direction to create a grating pattern (not shown). For areas where there is no input wiring data in the Y axis, the area is filled in by successively offsetting present lines by the pitch of a self-assembling material. Once the grating pattern is complete, the wiring data is subtracted from the grating data to create a conjugate wiring data (not shown).

The conjugate wiring data is biased in the X direction a suitable distance away from the X axis edges of the wiring data in FIG. 5A. By biasing the conjugate wiring data, the (maximum) dummy wiring pattern is created (not shown).

The input wiring data and the (maximum) dummy wiring pattern are combined and then subtracted from the pattern. This subtraction creates a customization template data (not shown).

Next, nearby wires on the same track in the input wiring data of FIG. 5A are merged in the X axis direction and subtracted from the grating pattern (not shown). Lines on adjacent (or nearby) tracks in this created data are merged in the Y axis direction, and elements of one wire width or less removed from the merged, created data (not shown). The merged, created data is then shifted one wire width (i.e., half a grating pitch) in the Y axis direction and subtracted from itself.

Figure 5B:
FIG. 5B is a view of an exemplary dummy wire pattern according to an embodiment of the present disclosure.

The results of this subtraction creates long lines of alignment-conferring template data (not shown) for the self-assembling material. Subtracting the alignment-conferring template data from the (maximum) dummy wiring pattern gives the (final) dummy wiring pattern, as shown in FIG. 5B. The alignment-conferring template data and the customization template data are then combined, to create a combined template data shown in FIG. 5C. Generally, the longer lines spanning a majority or greater of the X axis are the alignment-conferring template data and the smaller lines are the customization template data.

Figure 5C:
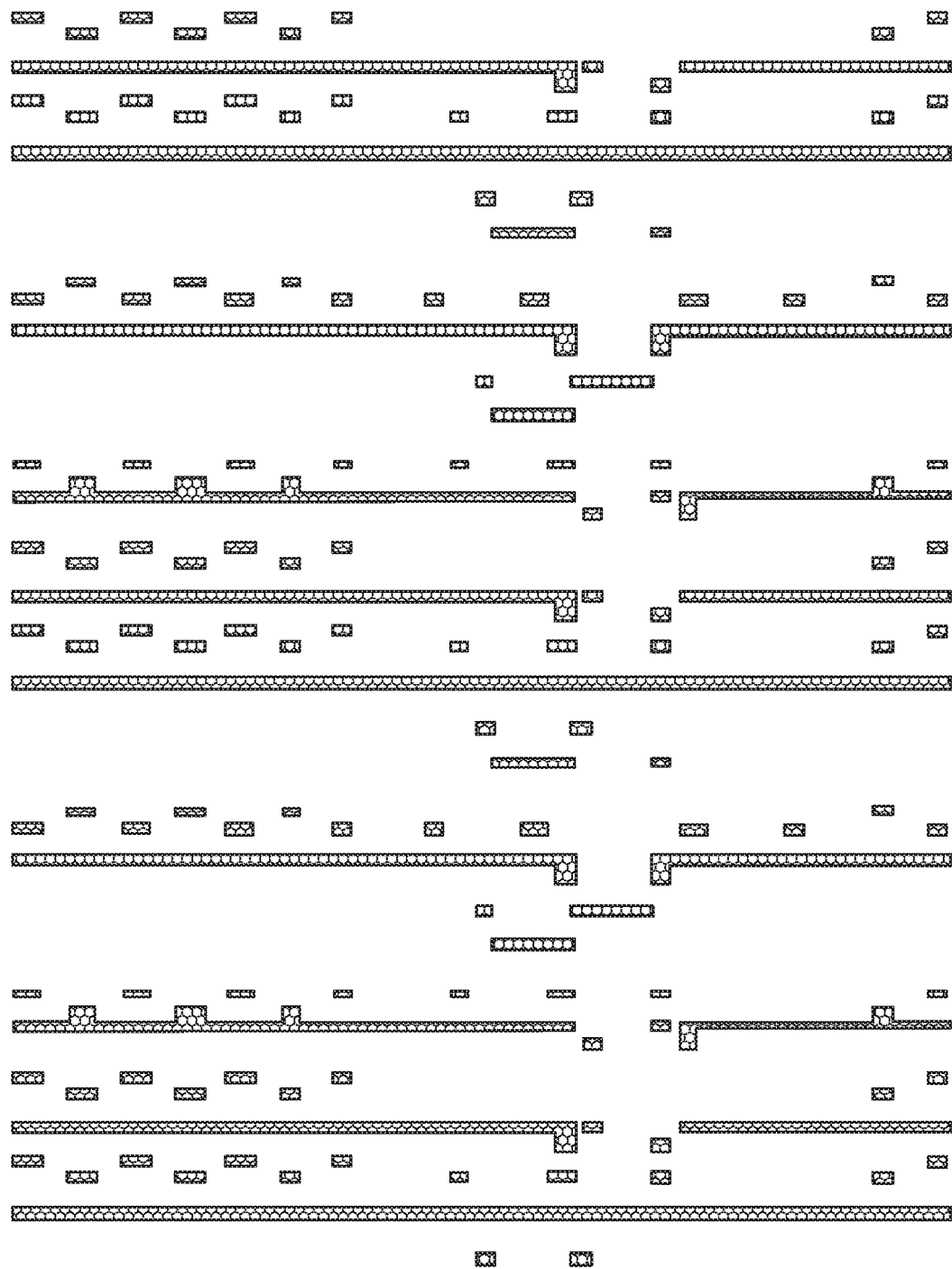
FIG. 5C is a view of an exemplary merged template pattern according to an embodiment of the present disclosure.
Figure 5D:
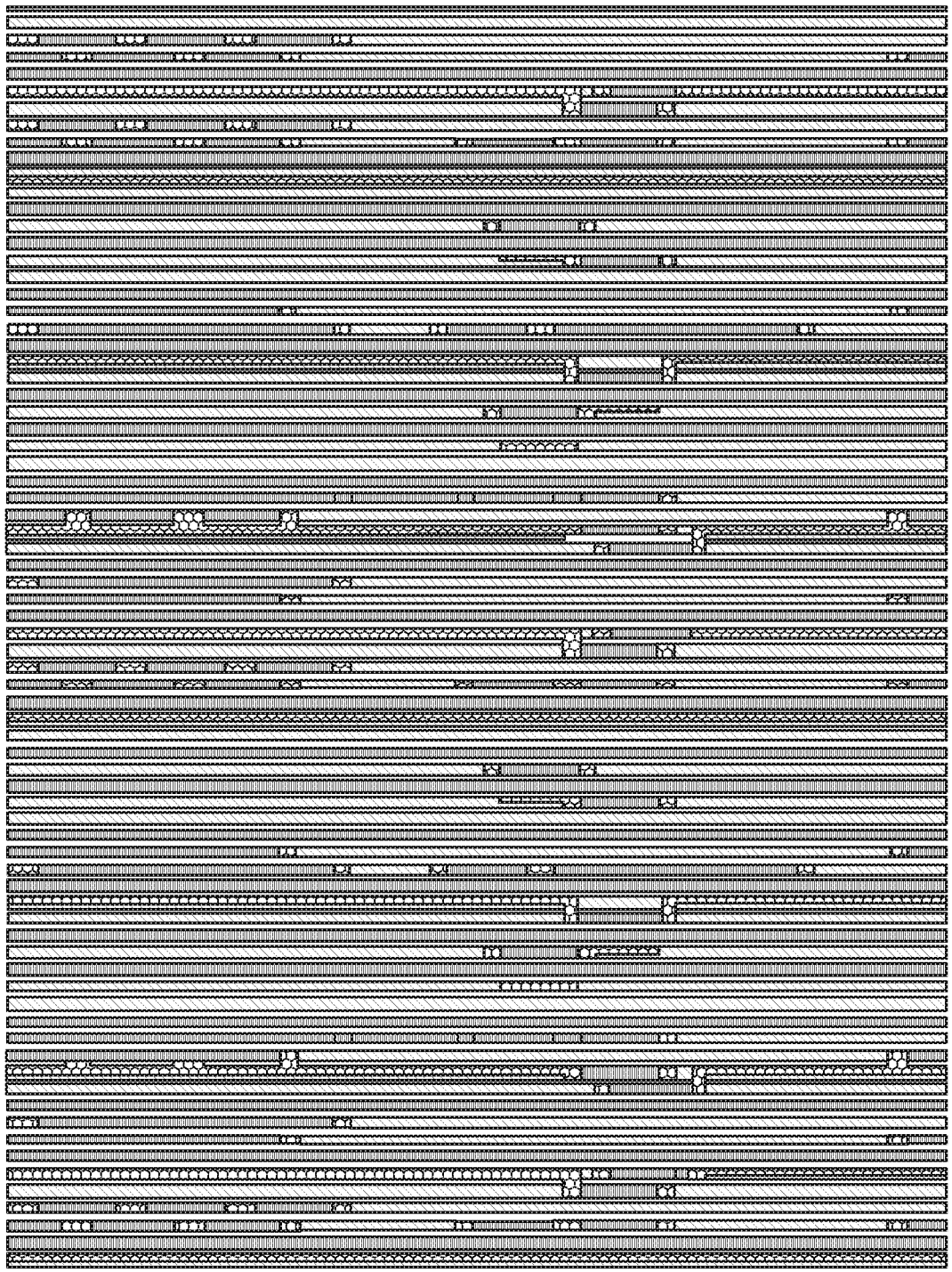
FIG. 5D is a view of an exemplary compilation of data from FIGS. 5A-5C according to an embodiment of the present disclosure.

FIG. 5D illustrates all data together, input wiring data of FIG. 5A, dummy wiring data of FIG. 5B and combined template data of FIG. 5C. This data present in FIG. 5D can then be used to pattern a material layer on a substrate.

As stated above, the above methods can be used in conjunction with the CHEETAH process. It is noted that the above discussed template pattern is discussed as the "prepattern" in the exemplary embodiment below.

A "chemical pattern layer" refers to a pattern-including layer formed by at least two chemically different materials. Self-assembled pattern formation is initiated by applying a layer of self-assembling material that forms chemically distinct at least first and second domains by segregation of polymeric block components to a surface of a substrate having a chemical pattern layer thereon. The top surface of the chemical pattern layer includes first and second regions, the first and second regions in turn including first and second materials, respectively. The first regions, which possess preferential chemical affinity for one of the polymeric block components, are arranged in a pattern herein referred to as the "prepattern." Thus, the first regions are also referred to collectively herein as the prepattern. The first material, which possesses preferential chemical affinity for one of the polymeric block components on at least its top surface, is referred herein as the "prepattern material" and a layer of the first material is herein referred to as a "prepattern material layer." A prepattern includes a prepattern material region (or regions). The second regions occupying the remainder of the top surface of the chemical pattern layer in plan view, referred to herein as the "orientation control material regions," are occupied by a second material that is referred herein as the "orientation control material." Either the prepattern material or the orientation control material, but not both, may include a material resistant to the etch process used to selectively remove one set of domains in the self-assembled pattern. As used herein, a removal process that removes a material is "selective" if the removal process removes only the removed material and does not remove other material. As used herein, if a first material is removed without removing a second material in a removal process, the removal process for the first material is "selective to" the second material. This material resistant to the etch process used to selectively remove one set of domains in the self-assembled pattern, referred to herein as the "etch-resistant material," grants a substantial difference in etch resistance between the prepattern material regions and the orientation control material regions. As used herein, two material regions possess substantially different etch resistances for a given etch process if the relative etch rates allow for pattern transfer through one material region selective to the other material region. The prepattern, which includes portions of alignment-conferring features, i.e., alignment-conferring prepattern portions, aligns the self-assembled pattern directly above the chemical pattern layer to these alignment-conferring features through chemical epitaxy. Masking features including the same prepattern material but which do no not participate in aligning the overlying self-assembled pattern may also be included in the prepattern. Portions of the prepattern including at least one masking feature are also referred to herein as "at least one masking feature prepattern portions".

In one embodiment, customization of line-space patterns can be performed using DSA of lamellae-forming polymers. The methods of the present disclosure are not limited to lamellae forming copolymers, but may be applied broadly to any self-assembling material that is amenable to chemical epitaxy. This may include self-assembling materials with cylindrical, spherical, or other morphologies. For example, a prepattern may be used to align an array of hexagonally packed substrate-perpendicular cylinders through chemical epitaxy. Selective removal of the cylindrical domains creates a hole pattern that may be transferred selectively in either the prepattern material regions or the orientation control material regions.

The chemically distinct domains formed by a self-assembling material upon phase segregation, i.e., phase separation, of the polymeric block components are intrinsically arranged with an ordered spatial periodicity across at least two adjacent like domains, whereby the adjacent domains "self-align" with each other according to this intrinsic ordered spatial periodicity. The ordered spatial periodicity may be one, two, or three dimensional, depending on the morphology of the self-assembling material, where the dimensionality of the self-alignment is equivalent to the dimensionality of the ordered spatial periodicity. In portions of the self-assembled pattern where the spatial period changes or the direction of the ordered spatial periodicity changes, the self-alignment of the domains of the self-assembling material is broken, and thus the domains are not self-aligned in these portions. Furthermore, for self-alignment of the domains of a self-assembling material with each other on a substrate, the domains must maintain the same orientation with respect to the substrate normal direction. Therefore, the self-alignment of substrate-perpendicular domains is disrupted in portions of the self-assembled pattern where entire domains or portions of domains assume an orientation parallel with the substrate or an orientation that is intermediate between parallel and perpendicular orientation. The domains in these portions are not self-aligned with substrate-perpendicular domains in other portions. As used herein, a domain is oriented substantially perpendicular to the substrate if its interfaces with an adjacent domain or domains deviate from the direction perpendicular with the substrate by less than 15 degrees for the majority of the self-assembling material thickness.

In one embodiment, the methods of the present disclosure can be implemented in three stages. First, a chemical pattern layer including a prepattern material and an orientation control material, one of which includes an etch-resistant material, is formed. Second, directed self-assembly (DSA)

of a self-assembling material is performed over the chemical pattern layer without formation of any horizontal interface between polymeric block components above the orientation control material. Third, upon completion of one or more selective etch processes, a composite pattern of the prepattern and an etched self-assembled pattern created by removing one or more polymeric block components selectively to the other polymeric block components in the self-assembling material, also referred to herein as a "second pattern," is transferred into an underlying layer or the substrate employing the etch-resistant material and the polymeric block component as a composite mask. The composite pattern, or a complement to the composite pattern, transferred to an underlying layer or the substrate is also referred to herein as a "transferred pattern."

For the directed self-assembly step, a solution containing at least one self-assembling material is prepared. Additional block copolymers, random copolymers, homopolymers, surfactants, photoacid generators, or nanoparticles may be optionally added to enhance directed self-assembly or etch contrast between distinct domains. The solution is cast on the substrate with the chemical pattern layer to form well-aligned polymer domains with frequency multiplication. Additional annealing (including thermal annealing, thermal gradient annealing, solvent vapor annealing, or another gradient field) may optionally be performed.

In directed self-assembly as performed in the present disclosure, some domains with preferential chemical affinity for the prepattern material form over alignment conferring features and align with these features. Adjacent and subsequent domains including like and different polymeric block components self-align with the domains forming over and aligned with the alignment-conferring features, generating an aligned self-assembled pattern.

For the pattern transfer to the substrate, an etch process can be used to selectively remove one set of polymeric domains relative to another set of polymeric domains, creating a second pattern. The patterned etch-resistant material is substantially unaffected by this etch process. A subsequent etch process may be used to transfer the second pattern selectively into the etch-resistant material or in areas not underlying the etch-resistant material. A union of the prepattern and the second pattern forms a composite pattern, which is transferred into the underlying substrate. Pattern transfer may be facilitated by a material stack underneath the chemical pattern layer. In one embodiment, the material stack may include a hard mask layer, which is an etch-resistant inorganic layer located underneath the chemical pattern layer and above an organic planarization layer (OPL). In one embodiment, the material stack may include an OPL directly underneath the chemical pattern layer. In one embodiment, the material stack can provide etch selectivity needed to transfer the composite pattern into underlying layers.

In certain cases, it may be desirable to invert the transferred pattern, which may be accomplished in a variety of ways. In an illustrative example, cavities formed by transfer of the pattern into the OPL may be filled with a fill material, such as a spin-on dielectric (SOD) material, having etch selectivity relative to the OPL in an etch. Optionally, the fill material may be treated to promote cross-linking or hardening. The OPL may be removed selective to the fill material to form a complementary pattern including fill material portions.

In the methods of the present disclosure, masking features are set directly in the prepattern. The alignment and orientation of self-assembling material domains above masking features has no effect in the fidelity of the composite pattern transferred into underlying layers due to the substantially different etch resistance between the prepattern material regions and the orientation control material regions.

Figure 6:
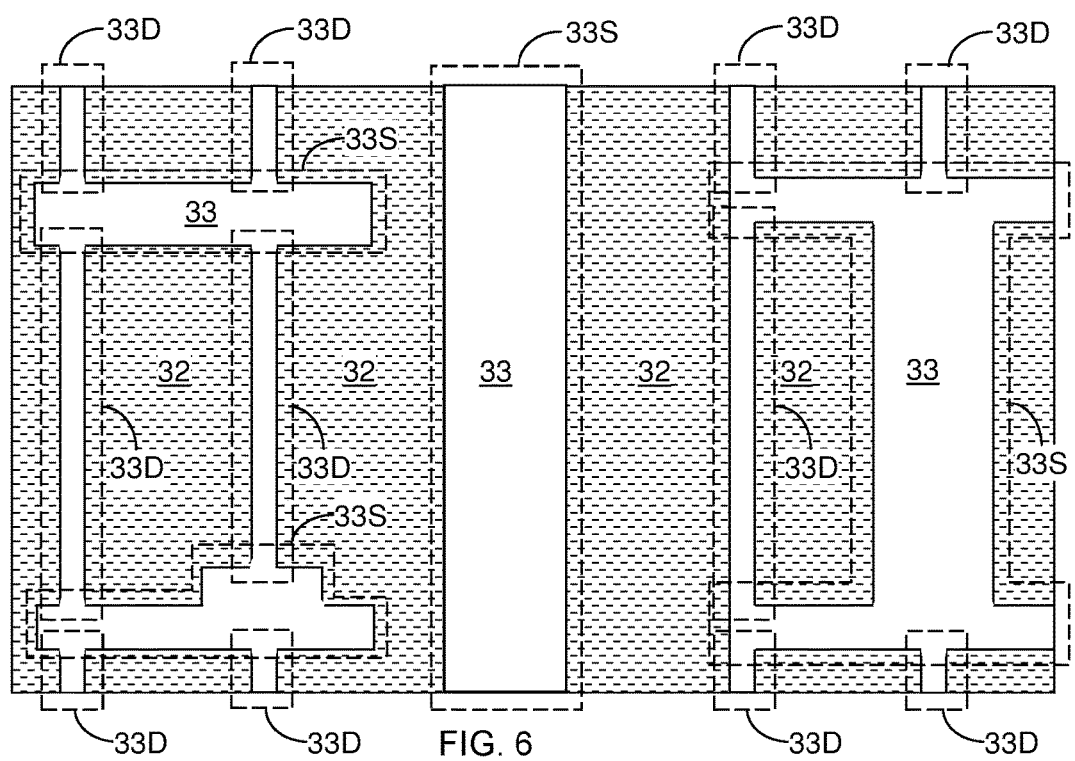
FIG. 6 is a top-down view of a first exemplary chemical pattern layer according to an embodiment of the present disclosure.

FIG. 6 depicts a first exemplary chemical pattern layer in a plan view, according to an embodiment of the present disclosure. The prepattern material region 33 includes alignment-conferring prepattern portions 33D and at least one masking feature prepattern portion 33S. Regions not occupied by the prepattern and its associated material are occupied by regions of the top surface of the orientation control material portion 32. As used herein, "orientation control material portion" refers to the orientation control material regions collectively. Either the prepattern material or the orientation control material, but not both, includes an etch-resistant material.

In one embodiment, the alignment-conferring prepattern portions 33D include a set of parallel lengthwise strips having a uniform width. The center lines along the lengthwise direction of the lengthwise strips of the alignment-conferring prepattern portions 33D are located at positions laterally separated from one another by distances substantially equal to integer multiples of a unit distance. As used herein, the distance of lateral separation between lengthwise strips of the alignment-conferring prepattern portions are substantially the same, i.e., substantially equal, to an integer multiple of the unit distance if one of the two dimensions differs by less than 10% relative to another of the two dimensions. In one embodiment, the uniform width of the lengthwise strips of the alignment-conferring prepattern portions 33D can be from 0.7 to 1.3 times the width of the domains for which they have preferential chemical affinity. As used herein, the uniform width of the lengthwise strips of the alignment-conferring prepattern portion 33D is substantially equal to the width of the domains for which they have preferential affinity if one of the two dimensions differs by less than 30% relative to another of the two dimensions. In another embodiment, the uniform width of the lengthwise strips of the alignment-conferring prepattern portions 30D can be from 1.05 to 1.95 times the unit distance. As used herein, the uniform width of the lengthwise strips of the alignment-conferring prepattern portion 33D is substantially equal to one and a half times the unit distance if one of the two dimensions differs by less than 30% relative to another of the two dimensions.

The centers of alignment-conferring features can be located at positions laterally separated from one another by the same integer multiple (e.g., three times) of the unit distance, or by different integer multiples (e.g., twice, three times, four times, and/or five times) of the unit distance. For example, the lengthwise center lines of the strips in the alignment-conferring prepattern portion 33D as illustrated in FIG. 6 can be located at positions laterally separated from a lengthwise center line of a neighboring strip, from left to right, by four times the unit distance, by ten times the unit distance, and by four times the unit distance, respectively.

The unit distance is determined by the distance of periodicity of self-assembling material domains. In one embodiment, the unit distance is selected to be substantially the same as the characteristic pitch. As used herein, the unit distance and the characteristic pitch are substantially the same, i.e., substantially equal, if one of the two dimensions differs by less than 10% relative to another of the two dimensions. The unit distance can be from 2 nm to 50 nm, although lesser and greater unit distances can also be employed.

The characteristic pitch of the self-assembling material may be defined in different ways. In one embodiment, the characteristic pitch is equal to the sum of the widths of two alternating domains. In another embodiment, the characteristic pitch is equal to the average minimum distance between the centers of like domains of a self-assembling material. In one embodiment, the characteristic pitch is equal to the periodicity of domains in a self-assembling material possessing two or more block components, where the basis for the periodicity may be determined by one or more chemically distinct domains.

In one embodiment, the lengthwise strips of the alignment-conferring prepattern portions can be non-contiguous along their lengthwise direction. The non-contiguous lengthwise strips are not limited in their aspect ratio. It is noted that the integer multiple of the unit distance of the distance of lateral separation between the lengthwise center lines of two strips of the alignment-conferring prepattern portions 33D can include zero. Thus, two strips with lengthwise centerlines laterally separated by an integer multiple of the unit distance equal to zero effectively share the same lengthwise center line. Strips of the alignment-conferring prepattern portion 33D may be separated from each other along the lengthwise direction of the alignment-conferring prepattern portion 33D by a variety of distances provided the alignment-conferring qualities of the prepattern are maintained.

Masking features in the masking-feature prepattern portions 33S enable the transfer of features unlike those in the self-assembled pattern alongside the self-assembled pattern, either by serving as a mask for pattern transfer by etching processes into material layers underneath the chemical pattern layer (32, 33) and/or the substrate, or by allowing this same pattern transfer regardless of the overlying self-assembled pattern. Masking features do not confer alignment to domains in a self-assembling material applied to the chemical pattern, nor do they disrupt alignment conferred by other features in the prepattern in at least the areas occupied by the orientation control material. Given the fact that masking features, as portions of the prepattern, include the same material as alignment-conferring features, the non-alignment-conferring character of masking features arises from constraints in their width or position. For example, a masking feature can have a width greater than the widths of individual domains with, selective affinity for the prepattern material, making it infeasible for a single domain to form on the masking feature and be so aligned with the masking feature. In another example, a masking feature is patterned so that its center is a distance from centers of the nearest alignment-conferring prepattern features that cannot be subdivided by the unit distance to be substantially equal to integer values.

In one embodiment, the at least one masking feature prepattern portions 33S include areas of the prepattern having a width greater than the width of domains for which the prepattern material has preferential chemical affinity. As used herein, the widths of areas of the at least one masking feature prepattern portions 33S are greater than the width of domains for which the prepattern material has preferential chemical affinity if the at least one masking feature prepattern portion area widths are more than 30% larger. In cases where this criterion is not met, the center lines along the lengthwise direction of the at least one masking feature prepattern portions 33S are located at positions laterally separated from the lengthwise center lines of alignment-conferring prepattern portions by a distance different from an integer multiples of the unit distance. As used herein, the distance between lengthwise center lines of at least one masking feature prepattern portions 33S and the lengthwise center lines of the lengthwise strips of the alignment-conferring prepattern portions 33D are different from an integer multiple of the unit distance if one of the two dimensions differs by more than 10% relative to another of the two dimensions. In one embodiment, widths of the at least one masking feature prepattern portions 33S can be different from the uniform width of the lengthwise strips of the alignment-conferring prepattern portions 33D. As used herein, the widths of areas of the at least one masking feature prepattern portions 33S are different from the uniform width of the lengthwise strips of the alignment-conferring prepattern portions 33D if one of the two dimensions differs by more than 30% relative to another of the two dimensions.

In one embodiment, the at least one masking feature prepattern portions 33S include areas of the prepattern that have a width greater than the width of domains for which the prepattern material has preferential chemical affinity, or which have lengthwise center lines substantially underlying the lengthwise center lines of domains for which the prepattern material does not have preferential affinity. In another embodiment, the at least one masking feature prepattern portions 33S include areas of the prepattern that have a width different from the uniform width of the lengthwise strips of the alignment-conferring prepattern portions 33D, or which have lengthwise center lines substantially underlying the lengthwise center lines of domains for which the prepattern material has preferential affinity. As used herein, the lengthwise center line of an area of the at least one masking feature prepattern portions 33S underlies the lengthwise center line of a domain of the self-assembling material if the lateral distance between the two center lines is less than half the width of the overlying domain.

At least the top surface of the prepattern material has a preferential chemical affinity for one of the polymeric block components. The prepattern material can be organic or inorganic and may include, but is not limited to, the following materials: a cross linked polymer including an epoxy-based homopolymer or copolymer; a surface modified homopolymer or copolymer; a self-assembled monolayer, a polymer brush-modified layer, or a cross-linked organosilicate; polymer or copolymer brushes, cross-linked copolymers, or mixtures of polymer brushes or cross-linked polymers; some anti-reflective coating (ARC) materials; or any combination of the foregoing materials. In one embodiment, this material includes an etch-resistant material. In this case, the prepattern material can include any material that is included in an etch-resistant material, and a prepattern material including an etch-resistant material that is formed on a substrate can be applied by any suitable method in which an etch-resistant material is applied.

A prepattern material layer formed on the substrate can be applied by any suitable method and is not particularly limited. Where the prepattern material is soluble in solutions, the application of prepattern material layers to a surface of the substrate can be accomplished by a process including, for example, spin-casting, dip-coating, doctor blading, spray dispense, or other suitable coating method, which is compatible with the processes and equipment used in microelectronics fabrication assembly lines. Exemplary casting solvents include, but are not limited to: toluene, propylene glycol methyl ether acetate (PGMEA), propylene glycol methyl ether (PGME), ethoxyethyl propionate, anisole, ethyl lactate, 2-heptanone, cyclohexanone, amyl acetate, n-butyl acetate, γ-butyrolactone (GBL), aqueous solutions, acetone, or a combination of the foregoing casting solvents.

The orientation control material portion 32 can include, for example, a thin dielectric material having a thickness from 1 nm to 20 nm. In one embodiment, the orientation control material portion 32 includes a material having substantially the same affinity to two different polymeric block components within a self-assembling material layer to be subsequently applied thereupon. In one embodiment, the orientation control material portion 32 can include random polymers, i.e., polymers that are obtained by polymerization of random sequences of different types of monomers. In one embodiment, the orientation control material portion 32 includes an etch-resistant material.

The orientation control material portion 32 includes a material having an orientation control surface that allows the domains of a self-assembling material to be subsequently applied thereupon to orient in a set direction with respect to the substrate. This direction may be substantially perpendicular to the substrate, but in some cases may be parallel, depending on the material selected for the orientation control material portion 32, or the annealing method used.

The mechanism for the orientation control by the orientation control material portion 32 in any specific context is contestable. Without wishing to be bound by any specific theory, the mechanism for the orientation control by the orientation control material portion 32 may depend on net surface energy, wetting characteristics, surface energy distribution, hydrogen bonding, net dipole moments, dipole moment density, or even composition. Materials creating the right characteristics for the orientation control material portion 32 may include: A cross linked organic polymer including an epoxy-based homopolymer or copolymer; a surface modified organic homopolymer or copolymer; a self-assembled monolayer, a polymer brush-modified layer, or a cross-linked organosilicate; random copolymer brushes, random cross-linked copolymers, or mixtures of polymer brushes or cross-linked polymers; some ARC materials, or even a properly and precisely oxidized silicon surface.

Polymer brushes can provide an orientation control surface, in which the surface is reactively modified to the desired thickness and surface properties using polymeric brush precursors with a desired composition, often followed by an additional rinse step to remove non-bound material. The composition of a random copolymer brush layer is tuned to afford the desired orientation control surface. This can be accomplished in some instances by randomly copolymerizing two monomers, for example the same monomers used in the self-assembling material (for the self-assembling material assembly), in a precise ratio. In instances where otherwise useful self-assembling materials (i.e., those that can form domains) exist for which it is unfeasible to synthesize random copolymers of repeating units of each polymeric block components (such as where different polymerization mechanisms would be required), end-group functionalization or incorporation of reactive-group containing monomers can be used to functionalize a polymers to provide grafting sites. [See e.g., P. Mansky, Y. Liu, E. Huang, T. P. Russell, C. Hawker, "Controlling polymer surface interaction with random copolymer brushes," *Science*, 275, 1458, (1997).] Thermally crosslinkable underlayers based on, for example, vinyl benzocyclobutene, may also be used. [See e.g., Du Yeol Ryu, Kyusoon Shin, Eric Drockenmuller, Craig J. Hawker, and Thomas P. Russell, "A generalized approach to modification of solid surfaces" *Science,* 308, 236, (2005)]. Photopatternable underlayers, based on random copolymers of the monomers of the self-assembling material with an appropriate functional monomer, for example, monomers having azide, glycidyl or acryloyl groups, may also be used. [See e.g., Joona Bang, Joonwon Bae, Peter Löwenhielm, Christian Spiessberger, Susan A. Given-Beck, Thomas P. Russell, and Craig J. Hawker, "Facile routes to patterned surface neutralization layers for block copolymer lithography," *Advanced Materials, vol.* 19, p. 4552 (2007)].

The orientation control surface can also be provided by use of a coating of a crosslinked epoxy-containing polymer prepared from monomers including glycidyl (meth)acrylate, 2,3-epoxycyclohexyl (meth)acrylate, (2,3-epoxycyclohexyl) methyl (meth)acrylate, 5,6-epoxynorbornene (meth)acrylate, epoxydicyclopentadienyl (meth)acrylate, and combinations including at least one of the foregoing. Herein, where "(meth)acrylate" is used, either an acrylate or methacrylate is contemplated unless otherwise specified. In some embodiments for example, specifically useful monomers include glycidyl methacrylate and epoxydicyclopentadienyl methacrylate.

Epoxy-containing polymers also include copolymers or terpolymers further containing at least one additional monomer in addition to the epoxy-containing monomer. Exemplary additional monomers include methyl (meth)acrylate, ethyl (meth)acrylate, butyl (meth)acrylate, hexyl (meth) acrylate, cyclohexyl (meth)acrylate, benzyl (meth)acrylate, ethylcyclopentyl (meth)acrylate, methylcyclopentyl (meth) acrylate, dicyclopentyl (meth)acrylate, 2-hydroxy ethyl (meth)acrylate, 2-hydroxy propyl (meth)acrylate, hydroxyadamantyl (meth)acrylate, adamantyl (meth)acrylate, methyladamantyl (meth)acrylate, ethyladamantyl (meth)acrylate, phenyladamantyl (meth)acrylate, hydroxyadamantyl (meth) acrylate, isobornyl (meth)acrylate, benzyl (meth)acrylate, gamma-butyrolactone (meth)acrylate, 5-methacryloxy-2,6-norbornane carbolactone, 5-acryloxy-2,6-norbornane carbolactone, 2,2,2-trifluoroethyl (meth)acrylate, 1,1,1,3,3,3-hexafluoroisopropyl (meth)acrylate, styrene, 4-methyl styrene, α-methyl styrene, 4-hydroxy styrene, 4-acetoxy styrene, ethylene, propylene, 1-butene, 1,3-butadiene, vinyl acetate, dihydropyran, norbornene, maleic anhydride, or a combination including at least one of the foregoing additional monomers. The composition of the epoxy-containing polymer can be adjusted by varying the ratios and identities of the comonomers and/or by selecting the structure and/or functionality of the pendant group(s) on the (meth)acrylates.

Useful exemplary glycidyl methacrylate polymers are described by Gopalan et. al. [Eungnak Han, Insik In, Sang-Min Park, Young-Hye La, Yao Wang, Paul F. Nealey, and Padma Gopalan, "Photopatternable imaging layers for controlling block copolymer microdomain orientation," *Advanced Materials, vol.* 19, pp. 4448 (2007).]. In an embodiment, specifically useful epoxy-containing polymers include poly(epoxydicyclopentadienyl methacrylate) homopolymer or poly(styrene-ran-epoxydicyclopentadienyl methacrylate), a random copolymer of styrene and epoxydicyclopentadienyl methacrylate.

Organosilicate or silicon oxide-based coatings on the substrate can also be used to provide the orientation control surface. In an embodiment, useful surfaces may be provided by deposition of silicon dioxide or organosilicate as a vapor-deposited layer, or as a spin-on layer (organic spin-on glass, abbreviated OSG). Organosilicones, organo- or hydridosilsesquioxanes, or hybrid systems of these materials may be used to provide the orientation control surface, where such organosilicate coatings are advantageously crosslinkable to form a solid orientation control surface. Useful organosilicates include those derived from the hydrolytic condensation, catalyzed by acid or base, of hydridotrialkoxysilanes, alkyltrialkoxysilanes, alkyltrihalosilanes, dialkyldialkoxysilanes, dialkyldihalosilanes, tetraalkoxysilanes, bis(alkylenetrialkoxysilanes), and the like. Exemplary alkoxysilanes useful for preparing organosilicates include hydridotrimethoxysilane, hydridotriethoxysilane, dimethyldimethoxysilane, dimethyldiethoxysilane, methyltrimethoxysilane, ethyltrimethoxysilane, ethyltriethoxysilane propyltrimethoxysilane, propyltriethoxysilane, cyclohexyltriethoxysilane, phenyltriethoxysilane, tetramethoxysilane, tetraethoxysilane (TEOS), 1,2-ethylene bis(triethoxysilane), vinyltrimethoxysilane, vinyltriethoxysilane, glycidoxypropyltrimethoxysilane, epoxycyclohexylethyltriethoxysilane, (meth)acryloxypropyltrimethoxypropylsilane, (meth)acryloxypropyltriethoxypropylsilane, combinations of these, and the like.

An orientation control material layer formed on the substrate can be applied by any suitable method and is not particularly limited. Where polymer-based orientation control material are desired, the application of such layers to a surface of the substrate can be accomplished by a process including, for example, spin-casting, dip-coating, doctor blading, spray dispense, or other suitable coating method, which is compatible with the processes and equipment used in microelectronics fabrication assembly lines.

Solvents that can be used to deposit polymeric coatings for the orientation control material layer vary with the solubility requirements of these materials. Exemplary casting solvents include, but are not limited to: toluene, propylene glycol methyl ether acetate (PGMEA), propylene glycol methyl ether (PGME), ethoxyethyl propionate, anisole, ethyl lactate, 2-heptanone, cyclohexanone, amyl acetate, n-butyl acetate, γ-butyrolactone (GBL), and acetone.

The surface energy or composition required for the orientation control material portion 32 depends on the application. For example, in order to form polystyrene (PS)-poly(methyl methacrylate) (PMMA) perpendicular lamellae, a PS-PMMA random copolymer layer may be employed as the orientation control material portion 32 in order to make the lamellae stand up with substantially vertical interfaces thereamongst. In one embodiment, for an unpatterned surface, the brush composition may be from 57% PS to 70% PS. However, if the orientation control material is formed alongside a prepattern material region including PS guiding lines, the optimal value is estimated to be about 43% styrene, and if formed alongside a prepattern to be subsequently formed and including PMMA guiding lines, the optimal value is estimated to be around 73% PS. Both are outside the window that is optimal for unpatterned surfaces. The ideal surface will also be different for perpendicular cylinders rather than lamellae, and also depends on the multiplication factor for spatial frequency multiplication. The multiplication factor for spatial frequency multiplication refers to the ratio of the pitch of the substantially parallel guide lines that are alignment-conferring prepattern portions to the periodicity of a self-assembling material.

For a given orientation control material portion 32, the efficacy of the orientation control at a particular composition can depend on the thickness of the orientation control material layer. The molecular architecture of the orientation control material can have an effect. For example, a polymer brush orientation control material may have a different composition range than for a cross-linked orientation control material due to difference in mobility of the brush. For the same reason, a higher molecular weight brush may act differently from a lower molecular weight brush. Similar changes in the efficacy of orientation control may be observed for cross-linked orientation control materials having the same composition but different molecular weights.

The efficacy of orientation control may also depend on the thickness of the self-assembly material layer above the orientation control material layer according to the relative difference in surface free energies among the polymeric block components. The exact orientation of polymer domains at the air interface or the polymer/orientation control interface may not be perpendicular to the substrate, even if the majority of each polymer domain is. The orientation-control material may still function even when it is weakly preferential. In some embodiments, the orientation control material may not cause polymer domains not to stand perpendicular to the substrate. For example, spheres or parallel cylinders may be employed as shapes of a phase-separated polymeric component in order to subsequently create hole patterns or line patterns.

The etch-resistant material includes a material that is resistant to another etch chemistry to be subsequently employed to the etch of a polymeric block component selective to another polymeric block component within a self-assembling material to be subsequently employed.

If the self-assembling material to be subsequently employed includes a first polymeric block component and a second polymeric block component, the etch-resistant material can include a material having a greater chemical affinity for the first polymeric block component than the second polymeric block component, or a greater chemical affinity for the second polymeric block component than the first polymeric block component.

The etch-resistant material can include, but is not limited to, a material selected from hydrogen silsesquioxane, methyl silsesquioxane, an alkyl silsesquioxane, an alkene silsesquioxane, an aryl silsesquioxane, an arylene silsesquioxane, a silicon-based resist, an inorganic resist, a silicon-based ARC, a metal-based ARC, silicon oxide, silicon nitride, a silicon oxynitride, a silicon-based spin-on-dielectric, a metal, a metal oxide, a metal nitride, a metal oxynitride, and a metal carbide, provided that a suitable etch chemistry exists for removing some domains of a self-assembling material selectively to other domains and the etch-resistant material, and provided that another suitable etch chemistry exists for removing the material of the orientation control material layer 32 or the prepattern material 33 selective to the material of the etch-resistant material. In one embodiment, the etch-resistant material can include hydrogen silsesquioxane.

A layer of etch-resistant material formed on the substrate can be deposited by any suitable method and is not particularly limited. Where the etch-resistant material is soluble in solutions, the application of an etch-resistant material layer to a surface of the substrate can be accomplished by a process including, for example, spin-casting, dip-coating, doctor blading, spray dispense, or other suitable coating method, which is compatible with the processes and equipment used in microelectronics fabrication assembly lines. Exemplary casting solvents include, but are not limited to: toluene, propylene glycol methyl ether acetate (PGMEA), propylene glycol methyl ether (PGME), ethoxyethyl propionate, anisole, ethyl lactate, 2-heptanone, cyclohexanone, amyl acetate, n-butyl acetate, γ-butyrolactone (GBL), aqueous solutions, acetone, or a combination of the foregoing casting solvents.

In another example, the etch-resistant material can be deposited from the vapor phase by a process including, chemical vapor deposition (CVD), plasma enhanced CVD, atomic layer deposition (ALD), sputtering, thermal evaporation, electron beam evaporation, pulsed laser deposition, or other suitable deposition method that is compatible with the processes and equipment used in microelectronics fabrication.

Figure 7A:
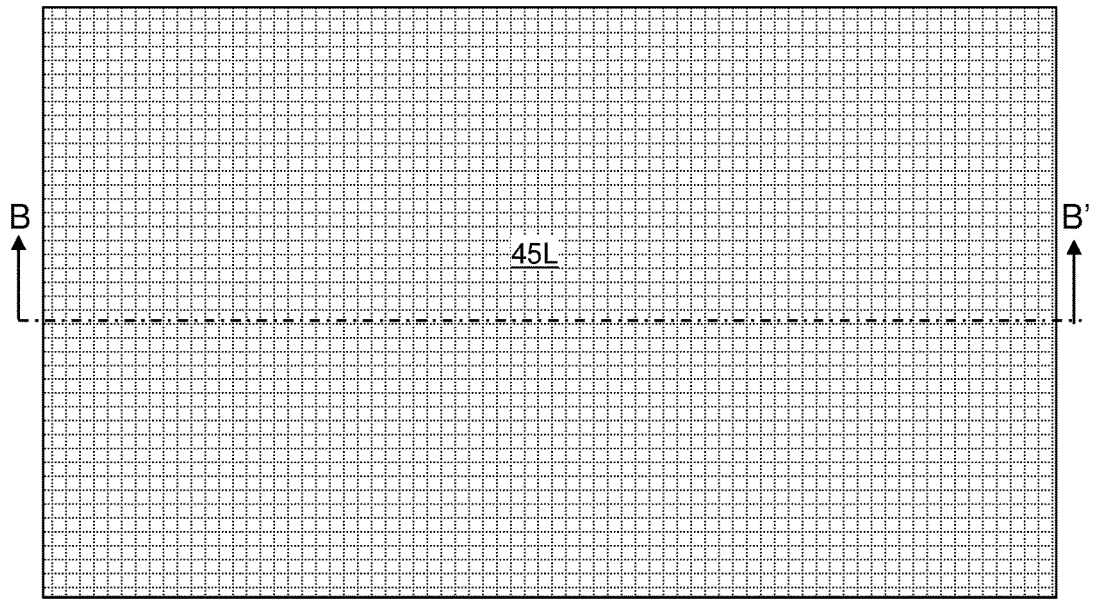
FIG. 7A is a top-down view of a first exemplary structure after application of a self-assembling material according to an embodiment of the present disclosure.
Figure 7B:
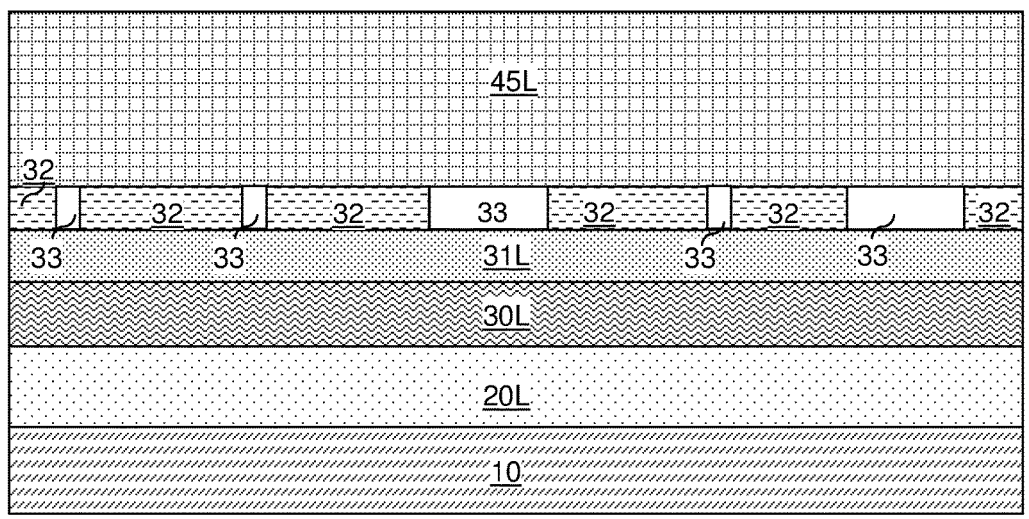
FIG. 7B is a vertical cross-sectional view of the first exemplary structure along the vertical plane B-B' of FIG. 7A.

Referring to FIGS. 7A and 7B, a self-assembling material is applied over the chemical pattern layer (32, 33) including the orientation control material portion 32 and the prepattern material region 33 to form a self-assembling material layer 45L. The material layers underneath the chemical pattern layer (32, 33) include a stack, from bottom to top, of a substrate 10, a material layer 20L, an organic planarization layer (OPL) 30L, and a hard mask layer 31L. This stack, including the chemical pattern layer, makes up a first exemplary structure according to an embodiment of the present disclosure. The self-assembling material can be applied, for example, by spin coating. The self-assembling material includes but is not limited to block copolymers, block terpolymers, homopolymers, and blends of these polymers, and is capable of self-organizing into nanometer-scale patterns. The self-assembling material includes at least a first polymeric block component and a second polymeric block component that are immiscible with each other. The self-assembling material may be self-planarizing. In one embodiment, the material of the hard mask layer 31L may be an etch-resistant material. In one embodiment, the material included by the hard mask layer 31L may be the same material as the orientation control material portion 32 or the material included by the prepattern material region 33, but not both.

The substrate 10 can be a semiconductor substrate, a dielectric substrate, a conductive material substrate, or a combination thereof. In one embodiment, the substrate 10 can include a bulk semiconductor substrate or a semiconductor-on-insulator (SOI) substrate as known in the art. The substrate 10 can optionally include semiconductor circuits or circuit elements, such as CMOS field effect transistors (FET). The substrate 10 can optionally also include a metal interconnect structure including at least one dielectric material layer and metal lines and/or metal via structures embedded therein. The top surface of the substrate 10 can be planar, or can have a non-planar topography.

The material layer 20L can be a conductive material layer, a dielectric material layer, a semiconductor material layer, or a stack thereof. The material layer 20L is a layer to be subsequently patterned by transferring a composite pattern of the prepattern and the second pattern. In one embodiment, the material layer 20L can be a dielectric hard mask layer such as a silicon nitride layer or a silicon oxide layer. The thickness of the material layer 20L can be from 5 nm to 100 nm, although lesser and greater thicknesses can also be employed. The material layer 20L may have the same thickness throughout, or may include a preexisting pattern (not shown). The top surface of the material layer 20L may be planar, or may include topographic features (i.e., include a non-planar surface).

The OPL 30L includes an organic planarizing material. As used herein, an organic planarizing material is an organic material such as a polymer that is applied with a surface having topography to provide a smooth and planar top surface. The material OPL 30L can include, but is not limited to, a material selected from organic resists, amorphous carbon, or proprietary organic hard mask materials. Exemplary organic hard mask materials include JSR HM8102 and Shin-Etsu ODL401. In one embodiment, the material of the OPL 30L may flow at ambient temperature and pressure (20° C. and 1 atm) or at an elevated temperature less than 500° C. The formulation of the OPL 30L can be selected to provide sufficiently low viscosity so that a top surface of the OPL 30L is planar over any underlying topographic features. The OPL 30L can be applied by any suitable method and is not particularly limited. Where polymer-based OPL 30L layers are desired, the application of such layers to a surface of the substrate can be accomplished by a process including, for example, spin-casting or another suitable coating method, which is compatible with the processes and equipment used in microelectronics fabrication assembly lines. OPL 30L layers may also be deposited from the vapor phase by processes including, for example, chemical vapor deposition. The OPL 30L may be optionally annealed to promote cross-linking and improve its mechanical stability during and after transfer by an etch process of patterns to the OPL layer 30L. In one embodiment, cross-linking may be promoted by a thermal anneal performed, for example, at an elevated temperature from about 200° C. to about 500° C. for a duration from 30 seconds to about 5 minutes. In one embodiment, the self-planarizing material of the OPL 30L can be an amorphous carbon layer. The thickness of the OPL 30L can be from 10 nm to 300 nm, although lesser and greater thicknesses can also be employed.

The hard mask layer 31L is formed on top of the OPL 30L. The hard mask layer 31L includes a hard mask material such as silicon oxide, silicon nitride, silicon oxynitride, a silicon-titanium- or tungsten-based anti-reflective coating (ARC) material as known in the art, or combinations thereof. The hard mask layer 31L can be formed, for example, by chemical vapor deposition (CVD), atomic layer deposition (ALD), or spin-coating. The thickness of the hard mask layer 31L can be from 1 nm to 20 nm, although lesser and greater thicknesses can also be formed. The hard mask layer 31L can be employed to reduce structural or compositional damage to the OPL 30L during removal of domains at a subsequent processing step.

The self-assembling material layer 45L can include at least a first polymer material, i.e., a first polymeric block component, and a second polymer material, i.e., a second polymeric block component; additional polymeric block components can also be included. At least two polymeric block components in the self-assembling material are structurally, compositionally, or both compositionally and structurally non-identical. The distinct polymeric block component are selected such that a self-aligned self-assembled structure of distinct at least first and second chemical domains, each domain including its respective polymeric block component, can be subsequently formed upon phase separation of the polymeric block components.

The self-assembly material layers 45L that may be used include diblock copolymers, triblock copolymers or terpolymers, or multiblock copolymers or terpolymers. The block components themselves can be homopolymers or copolymers. Different kinds of block copolymers can be included in the self-assembling material, including an amphiphilic organic block copolymer, amphiphilic inorganic block copolymer, organic diblock copolymer, organic multi-block copolymer, inorganic-containing diblock copolymer, inorganic-containing multi-block copolymer, linear block copolymer, star block copolymer, dendritic block copolymer, hyperbranched block copolymer, graft block copolymer, or a combination including at least one of the foregoing block copolymers. In an embodiment, the self-assembling material is a diblock copolymer.

Where used, inorganic constituents of inorganic-containing polymers, including inorganic-containing homopolymers, copolymers, and block copolymers, and inorganic-containing monomers, molecules, and additives include, for example, those based on silicon, germanium, iron, titanium, aluminum, or the like. Exemplary silicon- and germanium-containing monomers and polymers can include those disclosed by H. Ito in "Chemical Amplification Resists for Microlithography" *Adv. Polym. Sci.*, vol. 172, pp. 37-245 (2005); exemplary metal containing monomers and polymers include those disclosed by Ian Manners in "Synthetic Metal-containing Polymers," Wiley-VCH, 2004; exemplary silicon-containing molecules and additives such as organosilicates include those disclosed by E. M. Freer, L. E. Krupp, W. D. Hinsberg, P. M. Rice, J. L. Hedrick, J. N. Cha, R. D. Miller, and H. C. Kim in "Oriented mesoporous organosilicate thin films," *Nano Letters*, vol. 5, 2014 (2005); and exemplary metal-containing molecules and additives include those disclosed by Jinan Chai http://www.nature.com/nnano/journal/v2/n8/abs/nnano.2007.227.html—a1http://www.nature.com/nnano/journal/v2/n8/abs/nnano.2007.227.html—a2, Dong Wang http://www.nature.com/nnano/journal/v2/n8/abs/nnano.2007.227.html—a1, Xiangning Fan, and Jillian M. Buriak http://www.nature.com/nnano/journal/v2/n8/abs/nnano.2007.227.html—a1http://www.nature.com/nnano/journal/v2/n8/abs/nnano.2007.227.html—a3, "Assembly of aligned linear metallic patterns on silicon," *Nature Nanotechnology*, vol. 2, p. 500, (2007).

Exemplary materials for the first polymeric block component and the second polymeric block component are described in U.S. Pat. No. 7,605,081 to Yang et al., issued on Oct. 20, 2009, the contents of which are incorporated herein by reference. Specific examples of self-assembling block copolymers may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). Other exemplary block copolymers that are contemplated for use in the present method include diblock or triblock copolymers such as, poly(styrene-b-alkenyl aromatics), poly(styrene-b-(ethylene-propylene)), poly(ethylene oxide-b-caprolactone), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-dimethylsiloxane), poly(vinyl pyridine-b-dimethylsiloxane), poly(ethylene oxide-b-dimethylsiloxane), poly(methyl methacrylate-b-dimethylsiloxane), poly(isoprene-b-dimethylsiloxane), poly(isoprene-b-vinyl pyridine), partially epoxidized poly (styrene-b-isoprene) poly(butadiene-b-vinyl pyridine), poly(trimethylsilyl styrene-b-lactic acid), poly(styrene-b-lactic acid), poly(styrene-b-hydroxystyrene), poly(styrene-b-acrylic acid), poly(ethylene oxide-b-hydroxystyrene), poly (methyl methacrylate-b-vinyl pyridine), poly(ethylene oxide-b-methyl methacrylate-b-styrene), poly(styrene-b-isoprene-b-ethylene oxide), poly(methyl methacrylate-b-styrene-b-methyl methacrylate), poly(isoprene-b-styrene-b-ferrocenyldimethylsilane), poly(styrene-b-trimethylsilyl styrene-b-styrene) or a combination including at least one of the foregoing block copolymers.

The self-assembling material is first dissolved in a suitable solvent system to form a self-assembling material solution, which is then applied over the chemical pattern layer (32, 33) to form the self-assembling material layer 45L. The solvent system used for dissolving the self-assembling material and forming the self-assembling material solution may include any suitable solvent, which can include, but is not limited to: toluene, propylene glycol methyl ether acetate (PGMEA), propylene glycol methyl ether (PGME), ethoxyethyl propionate, anisole, ethyl lactate, 2-heptanone, cyclohexanone, amyl acetate, n-butyl acetate, γ-butyrolactone (GBL), and acetone. The self-assembling material is not a conventional photoresist that may be developed upon exposure to ultraviolet light or optical light. Also, the self-assembling material layer 45L is not a conventional low-k dielectric material.

Figure 8A:
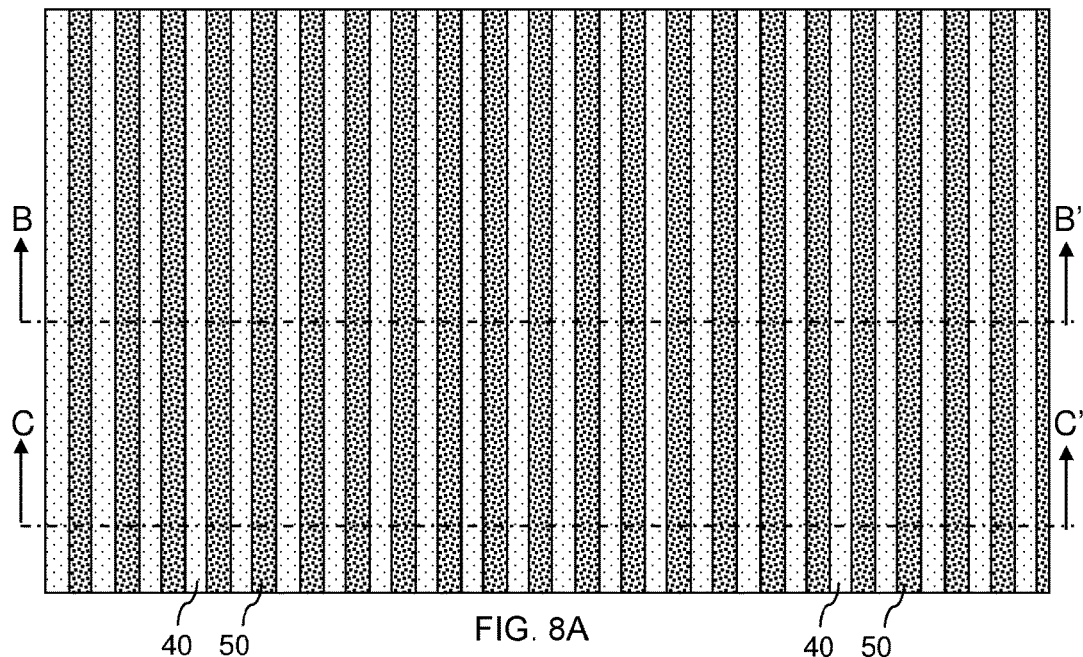
FIG. 8A is a top-down view of the first exemplary structure after directed self-assembly of the self-assembling material according to an embodiment of the present disclosure.
Figure 8B:
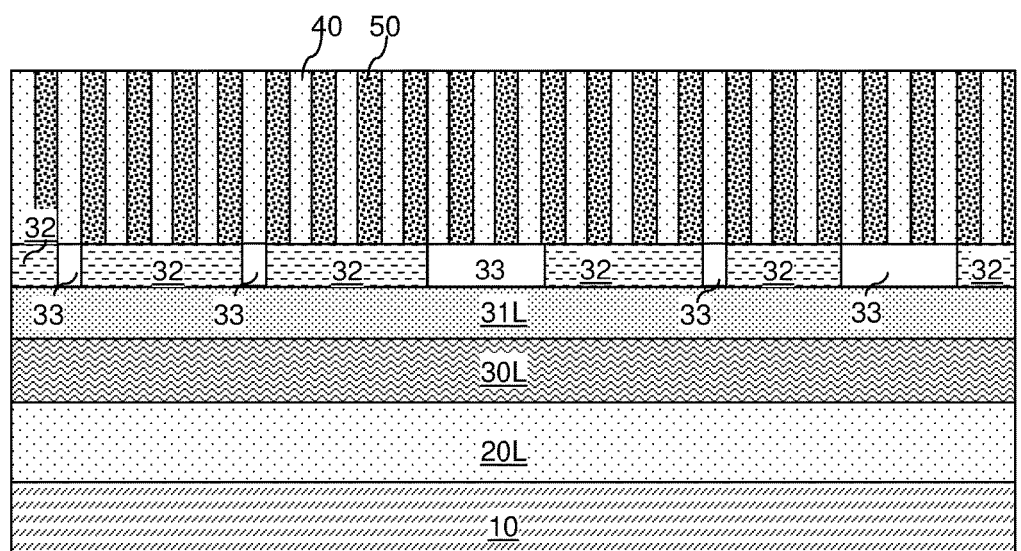
FIG. 8B is a vertical cross-sectional view of the first exemplary structure along the vertical plane B-B' of FIG. 8A.
Figure 8C:
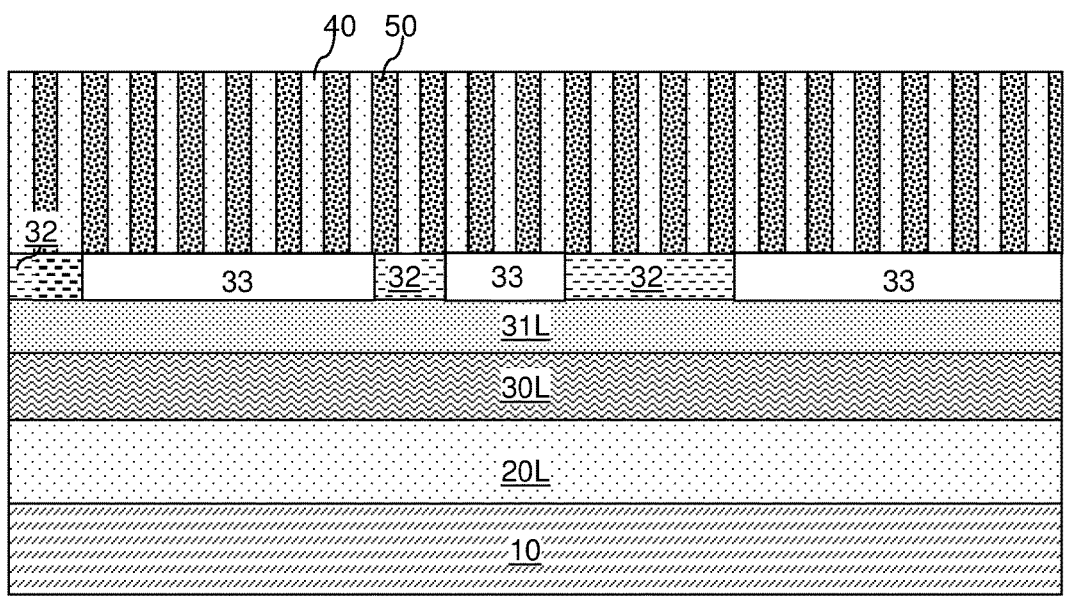
FIG. 8C is a vertical cross-sectional view of the first exemplary structure along the vertical plane C-C' of FIG. 8A.

Referring to FIGS. 8A, 8B, 8C, a nanoscale self-assembled self-aligned structure is formed over chemical pattern layer (32, 33) by phase separation of the first and second polymeric block components. The phase separation of the polymeric block components can be achieved, for example, by annealing at an elevated temperature. Through chemical epitaxy, self-alignment of first and second domains of the self-assembling material to the alignment-conferring prepattern portions can be induced. The nanoscale self-assembled self-aligned structure is aligned to the alignment-conferring prepattern portions 33D, and is herein referred to as a "self-aligned assembly."

In one embodiment, the self-assembling layer 45L is annealed by flash lamp, laser spike annealing, microwave annealing, or thermal annealing at an elevated temperature to form first domains 40 including the first polymeric block component and second domains 50 including the second polymeric block component. The anneal may be performed, for example, at an elevated temperature from about 50° C. to about 300° C. for a duration from 30 seconds to about 48 hours. The self-assembling layer 45L can also be annealed by exposure to solvent vapors at a controlled vapor pressure at room temperature or elevated temperature, also known as solvent vapor annealing, to form first domains 40 including the first polymeric block component and second domains 50 including the second polymeric block component. The anneal may be performed, for example, between temperatures ranging from 10° C. to about 100° C. for a duration from 30 seconds to about 48 hours. In one embodiment, the solvent anneal may be performed in which the self-assembling material is simultaneously subjected to microwave radiation.

Specifically, the nanoscale self-assembled self-aligned structure is self-aligned to the alignment-conferring prepattern portions 33D (See FIG. 6). The size and density of the at least one masking feature prepattern portions 33S (See FIG. 6) can be selected such that the at least one masking feature prepattern portions 33S do not substantially interfere with the alignment of the first domains 40 and the second domains 50 to the alignment-conferring prepattern portions 33D. Thus, portions of the self-assembling material over the at least one masking feature prepattern portions 33S self-align to the domains aligned with the alignment-conferring prepattern portions 33D.

In one embodiment, the chemical composition of the self-assembling material layer 45L can be such that the immiscibility of the first and second polymeric block components enable self-assembly of the first polymeric block component into primary lamellar structures of the first domains 40 and the second polymeric block component assembles into complementary lamellar structures of the second domains 50. The first domains 40 constitute the primary lamellar structures including the first polymeric block component, and the second domains 50 constitute the complementary lamellar structures including the second polymeric block component.

In one embodiment, the first polymeric block component can be poly(methyl methacrylate) (PMMA), and the second polymeric block component can be polystyrene (PS). In this case, the sum of the first uniform width of the primary lamellar structures and the second uniform width of the complementary lamellar structures can be about 25 nm.

In one embodiment, each domain in the self-aligned assembly (40, 50) can be substantially perpendicular to the top surface of the orientation control material portion 32. Without such an orientation control material, the domains of the polymeric block components tend to orient parallel to the top surface of an underlying material layer (31L, 30L, 20L, or 10).

In one embodiment, the first and second polymeric block components form lamellar structures having substantially vertical interfaces thereamongst that are parallel to lengthwise direction of the alignment-conferring prepattern portions 33D after alignment. In other words, each of the first domains 40 and the second domains 50 can be a lamellar structure perpendicular to the substrate surface and phase separate along straight long edges between the prepattern material (33) and the orientation control material (32) of the chemical pattern layer (32, 33).

In one embodiment, the first and second polymeric block components can form alternating chemically distinct domains having a first width and a second width, respectively. In other words, the first domains 40 can have the first width, and the second domains 50 can have the second width. In this case, the characteristic pitch can be the sum of the first width and the second width. The first and second polymeric block components can be repeated at least twice with the characteristic pitch along a horizontal direction perpendicular to substantially vertical interfaces between the chemically distinct domains.

In one embodiment, the prepattern includes a material having a greater affinity to one of the first or second polymeric block components than to the other of the first or second polymeric block components. In one embodiment, the prepattern includes a material having a greater affinity to the first polymeric block components than to the second polymeric block component. In another embodiment, the prepattern includes a material having a greater affinity to the second polymeric block components than to the first polymeric block component. In either case, the (top surface of the) orientation control material has very similar affinity, i.e., substantially the same affinity, to both polymeric block components.

In one embodiment, the uniform width of some of the alignment-conferring prepattern portions 33D can be in a range from 0.7 times the width of the domain that overlies each center portion of such alignment-conferring prepattern portions 33D to 1.3 times the width of the domain that overlies each center portion of such alignment-conferring prepattern portions 33D. Thus, the uniform width of a set of alignment-conferring prepattern portions 33D can be in a range from 0.7 times a width of a chemically distinct domain of the one of the first polymeric block components or the second polymeric block components to 1.3 times the width of the chemically distinct domain of the one of the first polymeric block components or the second polymeric block components.

In one embodiment, the uniform width of the alignment-conferring prepattern portions 33D can be in a range from 1.05 times the unit distance to 1.95 times the unit distance. In such cases, the center of the domain not possessing preferential chemical affinity for the prepattern substantially overlies the center of the alignment-conferring prepattern portions 33D.

In one embodiment, the interface between the first domains 40 and the second domains 50 can be substantially vertical, i.e., perpendicular to the plane of the top surface of the orientation control material portion 32. Because the at least one masking feature prepattern portions 33S of the prepattern material region 33 do not substantially affect the self-assembly of the self-assembling material, and the alignment-conferring prepattern portions 33D predominantly determine the self-alignment of the self-assembling material upon phase separation, the interfaces between the first domains 40 and the second domains 50 can be substantially vertical over the at least one masking feature prepattern portions 33S. In this case, substantially vertical interfaces between the first domains 40 and the second domains 50 can straddle one or more of the at least one masking feature prepattern portion 33S.

In one embodiment, some first domains 40 and some second domains 50 overlying the at least one masking feature prepattern portions 33S do not self-align with the domains aligned with alignment-conferring prepattern portions 33D. Portions of these domains are not self-aligned with the domains aligned with alignment-conferring prepattern portions 33D may be substantially perpendicular to the substrate but not parallel with the lengthwise direction of the alignment-conferring prepattern portions 33D. Other portions of these domains not self-aligned with the domains aligned with alignment-conferring prepattern portions 33D may be oriented such that interfaces between the first domains 40 and the second domains 50 are not substantially vertical, or in other words perpendicular to the substrate. The orientation with respect to the substrate of these portions may be parallel or may be intermediate between parallel and perpendicular orientations. Thus, these domains are not self-aligned to the perpendicular domains aligned with the alignment-conferring prepattern portions 33D. In some cases, both the aforementioned portions not self-aligned with the domains aligned with alignment-conferring prepattern portions 33D may coexist overlying the at least one masking feature prepattern portions 33S.

In one embodiment, the first width of the first domains 40 can be in a range from 1 nm to 25 nm, and the second width of the second domains 50 can be in a range from 1 nm to 25 nm. In one embodiment, the sum of the first width and the second width can be in a range from 2 nm to 50 nm.

Figure 9A:
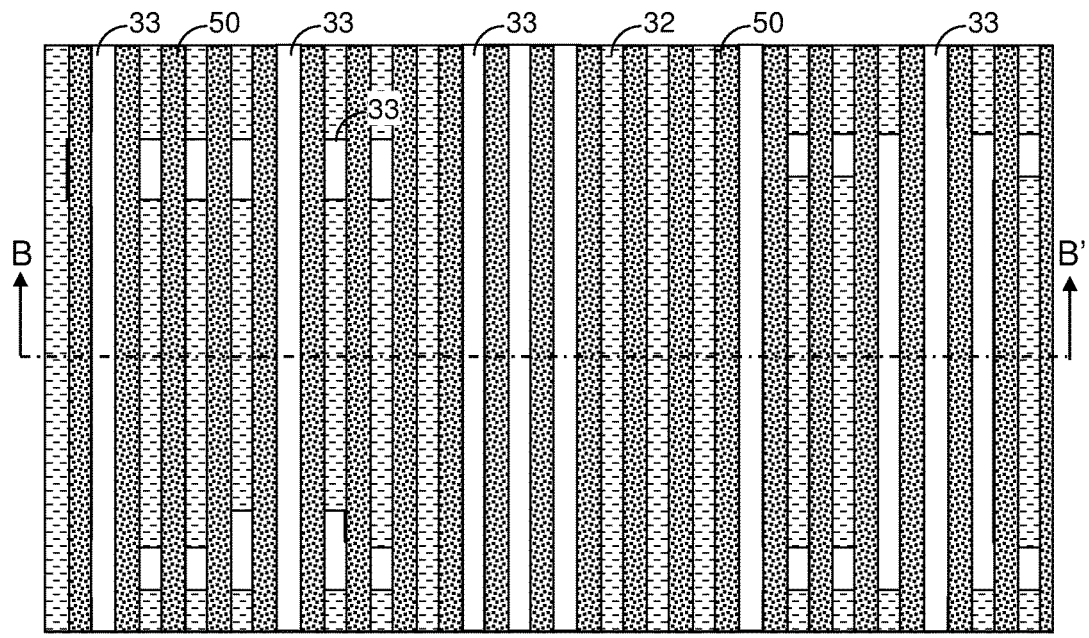
FIG. 9A is a top-down view of the first exemplary structure after selective removal of a first polymeric block component selective to a second polymeric block component without substantially etching the chemical pattern layer according to an embodiment of the present disclosure.
Figure 9B:
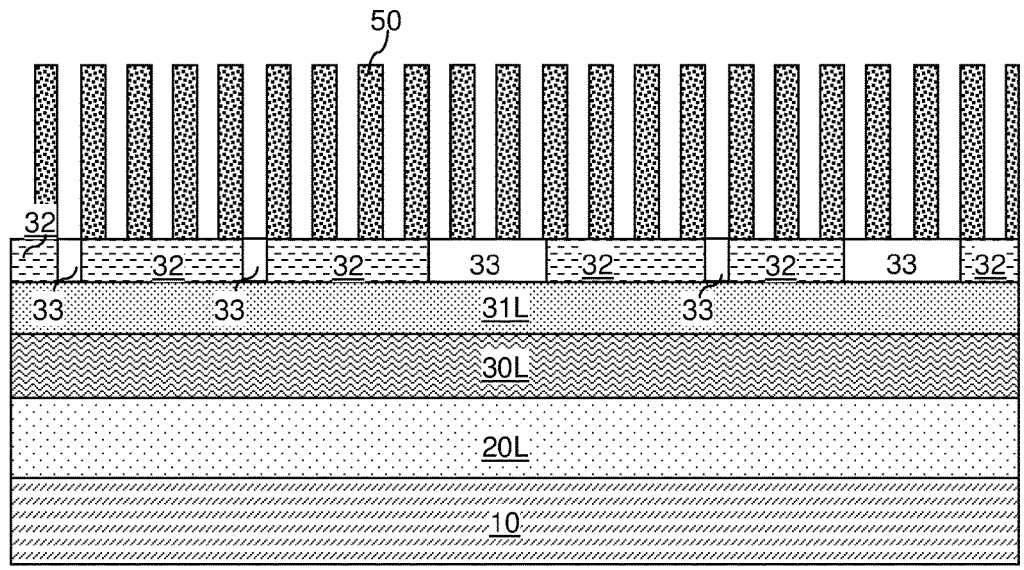
FIG. 9B is a vertical cross-sectional view of the first exemplary structure along the vertical plane B-B' of FIG. 9A.

Referring to FIGS. 9A and 9B, one type of domains is removed selective to the other type of domains. For example, the first domains 40 can be removed selective to second domains 50. In this case, the first polymeric block component is removed selective to the second polymeric block component without substantially etching the chemical pattern layer (32, 33) including the prepattern material region 33 and the orientation control material portion 32. The removal of the first domains 40 selective to the second domains 50 can be performed, for example, by an anisotropic etch that removes the first polymeric block component selective to the second polymeric block component. In one embodiment, the second domains 50 can be removed selective to first domains 40. In this case, the second polymeric block component is removed selective to the first polymeric block component without substantially etching the chemical pattern layer (32, 33) including the prepattern material region 33 and the orientation control material portion 32. The removal of the second domains 50 selective to the first domains 40 can be performed, for example, by an anisotropic etch that removes the second polymeric block component selective to the first polymeric block component.

A second pattern including the second domains 50 is formed over the chemical pattern layer (32, 33) including the prepattern material regions 33 and the orientation control material regions 32. The second domains 50 constitute a set of protruding structures that protrude above the top surface of the chemical pattern layer (32, 33). The areas in which the second domains 50 are present, or the areas in which the second domains 50 are absent, but not both, define the area of the second pattern. The prepattern and the second pattern can have a non-zero overlapping area. In other words, the intersection of the area of the prepattern and the area of the second pattern is non-zero, and corresponds to the areas in which portions of the second pattern overlie portions of the prepattern material region 33.

Figure 10A:
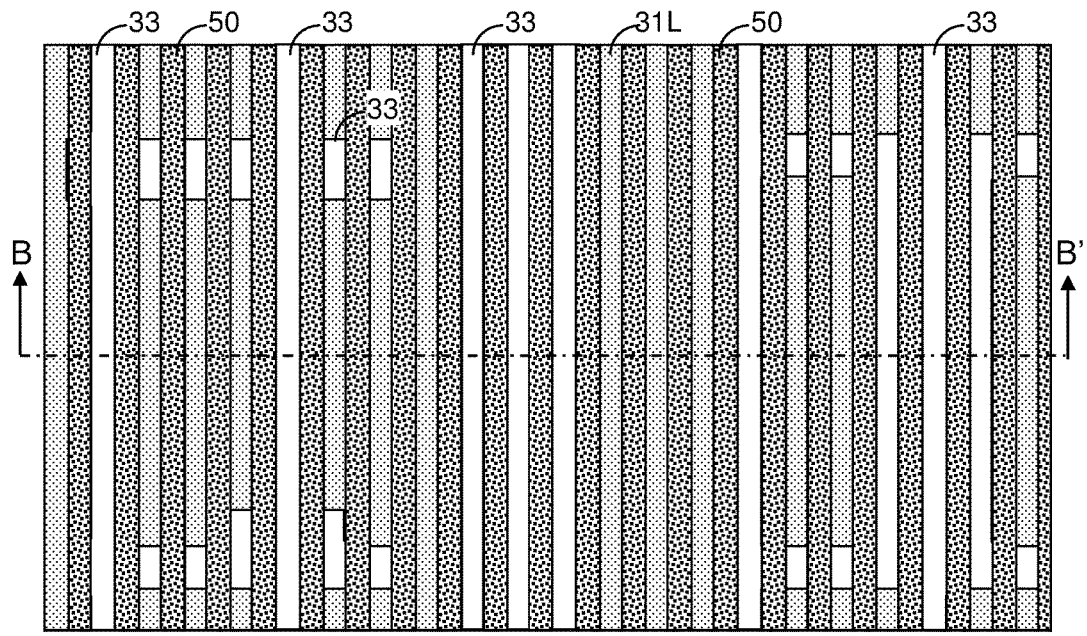
FIG. 10A is a top-down view of the first exemplary structure after transfer of a second pattern in the second polymeric block component into the orientation control material according to an embodiment of the present disclosure.
Figure 10B:
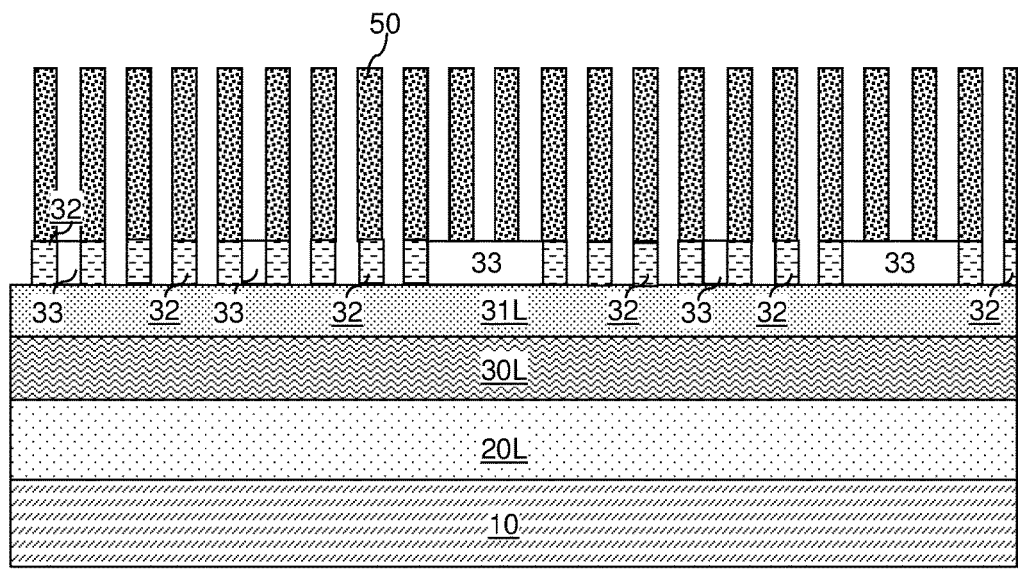
FIG. 10B is a vertical cross-sectional view of the first exemplary structure along the vertical plane B-B' of FIG. 10A.

FIGS. 10A and 10B refer to an embodiment of the present disclosure in which the prepattern material 33 includes an etch-resistant material. This prepattern including etch-resistant material is herein referred to as the "etch-resistant prepattern." Portions of the second pattern not intersecting the prepattern can be transferred into the orientation control material portion 32, for example, by an anisotropic etch to form a patterned orientation control material portion 32. Specifically, the orientation control material portion 32 can be etched employing the second polymeric block components as an etch mask. The etch used to transfer the second pattern into the orientation control material portion 32 can be the same etch used to selectively remove the first domains 40, or may be a subsequent etch. The union of the patterned orientation control material portion 32 and the prepattern include the composite pattern.

Figure 11A:
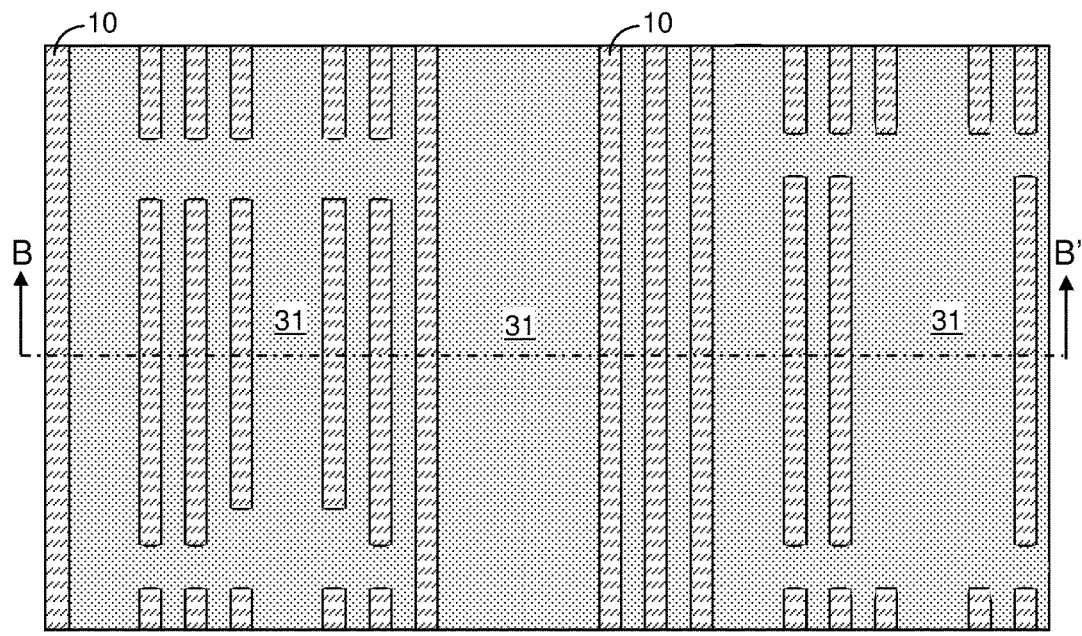
FIG. 11A is a top-down view of the first exemplary structure after transfer of the composite pattern of the prepattern and the second pattern into a hard mask layer, an organic planarization layer (OPL), and a material layer according to an embodiment of the present disclosure.
Figure 11B:
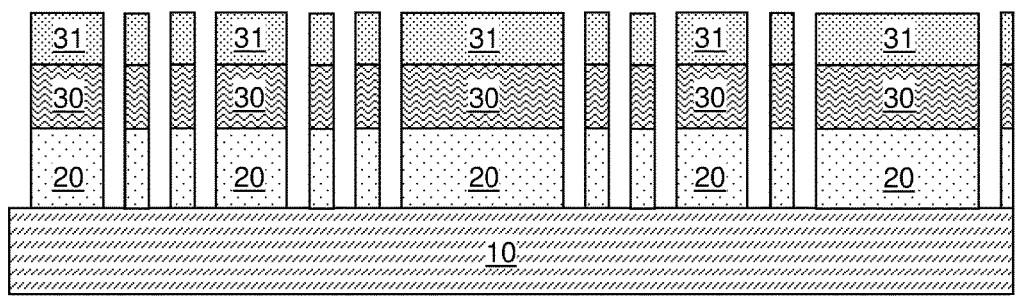
FIG. 11B is a vertical cross-sectional view of the first exemplary structure along the vertical plane B-B' of FIG. 11A.

Referring to FIGS. 11A and 11B, the composite pattern can be transferred into the hard mask layer 31L, the organic planarization layer (OPL) 30L, and the material layer 20L by at least one anisotropic etch. A patterned hard mask layer 31, a patterned OPL 30, and a patterned material layer 20 may be formed. The second block polymers 50, the etch-resistant prepattern material region 33, and the orientation control material portion 32 can be removed during the at least one anisotropic etch, or may be removed selective to the patterned hard mask layer 31 after patterning the hard mask layer 31L. In one embodiment, the patterned orientation control material portion 32 and/or the hard mask layer 31L may be consumed during the at least one anisotropic etch.

Figure 12A:
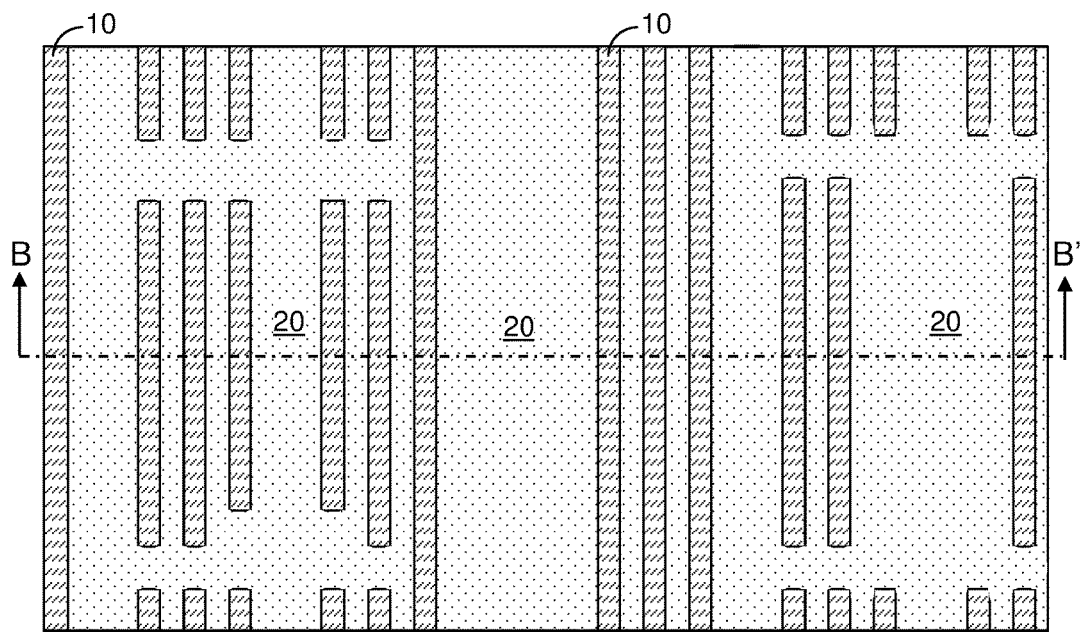
FIG. 12A is a top-down view of the first exemplary structure after removal of the hard mask layer and the OPL according to an embodiment of the present disclosure.
Figure 12B:
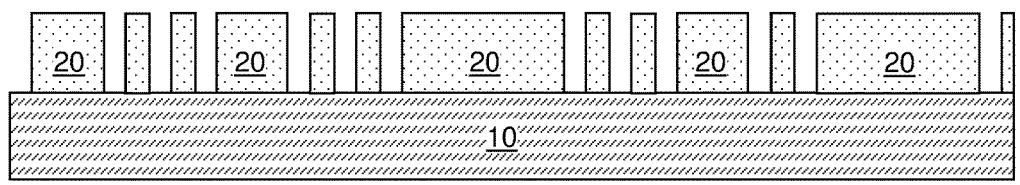
FIG. 12B is a vertical cross-sectional view of the first exemplary structure along the vertical plane B-B' of FIG. 12A.

Referring to FIGS. 12A and 12B, the patterned hard mask layer 31 and/or the patterned OPL 30 may be removed, for example, during the at least one anisotropic etch or during at least one subsequent etch. In one embodiment, the at least one subsequent etch can include a wet etch that dissolves the material of the patterned OPL 30. The area of the patterned material layer 20 corresponds to the area of the composite pattern.

The initially discussed methods are combined with the exemplary embodiment of the CHEETAH process as discussed below.

In an embodiment, a method of patterning a material layer on a substrate, comprises the following steps. Providing a substrate with a material layer thereupon. Forming a chemical pattern layer of the material layer according to a material input pattern data, the chemical pattern layer comprising a first material and a second material, wherein one of the first material and the second material comprises an etch-resistant material, on a substrate, wherein physically exposed top surfaces of the first material and physically exposed top surfaces of the second material complementarily overlie an entirety of the substrate, wherein regions in which top surfaces of the first material are physically exposed comprise a prepattern layer, the prepattern layer comprising an alignment-conferring template pattern.

The template pattern is formed by the method comprising the following steps. Inputting an input pattern data. Obtaining the grating pattern underlying the input pattern data to cover all of the input pattern data. Without loss of generality, lines of the ideal grating pattern are assumed to run parallel to the X axis. Subtracting the input pattern data from the grating pattern, to form a conjugate wiring pattern. Merging adjacent lines of the conjugate wiring pattern in a Y axis direction of the conjugate wiring pattern that are within a predetermined limit to form a merged conjugate wiring pattern. Shrinking the merged, conjugate wiring pattern in a Y axis direction by biasing it by a predetermined distance from a Y axis edge of the merged, conjugate wiring pattern to form the cut mask pattern. Subtracting the cut mask pattern from the merged, conjugate wiring pattern to create the template pattern.

Once the template pattern is created, the method includes the steps of applying a self-assembling material over the template pattern. Inducing self-alignment of periodically arranged chemically distinct polymeric block components of the self-assembling material to the template pattern, wherein portions of the self-assembling material over the template pattern become self-aligned to the template pattern. Removing one of the polymeric block components selective to the other of the polymeric block components and the etch-resistant material by an etch process to form an etched self-assembled pattern. And transferring a pattern into the material layer by an etch process, whereby the material layer is transformed into a patterned material layer containing the transferred pattern.

In an embodiment, the method can also include the following steps. Applying the cut mask to the patterned material layer. Exposing the cut mask to an etch process. And removing a portion of the patterned material layer.

In an embodiment, a method of patterning a material layer on a substrate includes the following steps. Providing a substrate with a material layer thereupon. Forming a chemical pattern layer of the material layer according to a material input pattern data, the chemical pattern layer comprising a first material and a second material, wherein one of the first material and the second material comprises an etch-resistant material, on a substrate, wherein physically exposed top surfaces of the first material and physically exposed top surfaces of the second material complementarily overlie an entirety of the substrate, wherein regions in which top surfaces of the first material are physically exposed comprise a prepattern layer, the prepattern layer comprising an alignment-conferring, merged template pattern.

The merged template pattern is formed by the following steps. Inputting an input pattern data. Obtaining the grating pattern underlying the input pattern data to cover all of the input pattern data. Without loss of generality, the lines of the grating pattern are assumed to run parallel to the X axis. Subtracting the input pattern data from the grating pattern, to form a conjugate wiring pattern. Shrinking the lines of the conjugate wiring pattern on both line ends, which can be accomplished by biasing the conjugate wiring pattern in the X axis direction by a negative amount, forming a dummy fill pattern. Subtracting the input pattern data and the dummy fill pattern from the grating pattern to form the customization template data. In the input pattern data, merging neighboring lines along the X axis, to form the merge input pattern data. This can be accomplished by biasing the input pattern data in the X axis direction by a given positive amount, then healing the pattern and biasing the healed pattern by the same amount in the negative direction. Subtracting the merged input pattern data from the grating pattern. Merging adjacent lines on consecutive wiring tracks of the grating in the Y axis direction to create merged Y data. Removing portions that are one wire width or less to form merged line width Y data. Shifting merged line width Y data by one wire width in the Y axis direction to create the shifted, merged Y data. Subtracting the shifted, merged Y data from the merged line width Y data to form alignment conferring template data. And combining the alignment conferring template data with the customization template data to create the merged template data. In this process no cut mask is created, instead, dummy lines were generated that partly fill empty spaces of the input pattern data without changing the connectivity of the input pattern.

Once the merged template data is created, the method includes the steps of applying a self-assembling material over the merged template pattern. Inducing self-alignment of periodically arranged chemically distinct polymeric block components of the self-assembling material to the merged template pattern, wherein portions of the self-assembling material over the merged template pattern become self-aligned to the merged template pattern. Removing one of the polymeric block components selective to the other of the polymeric block components and the etch-resistant material by an etch process to form an etched self-assembled pattern. And transferring a pattern into the material layer by an etch process, whereby the material layer is transformed into a patterned material layer containing the transferred pattern.

Figure 13:
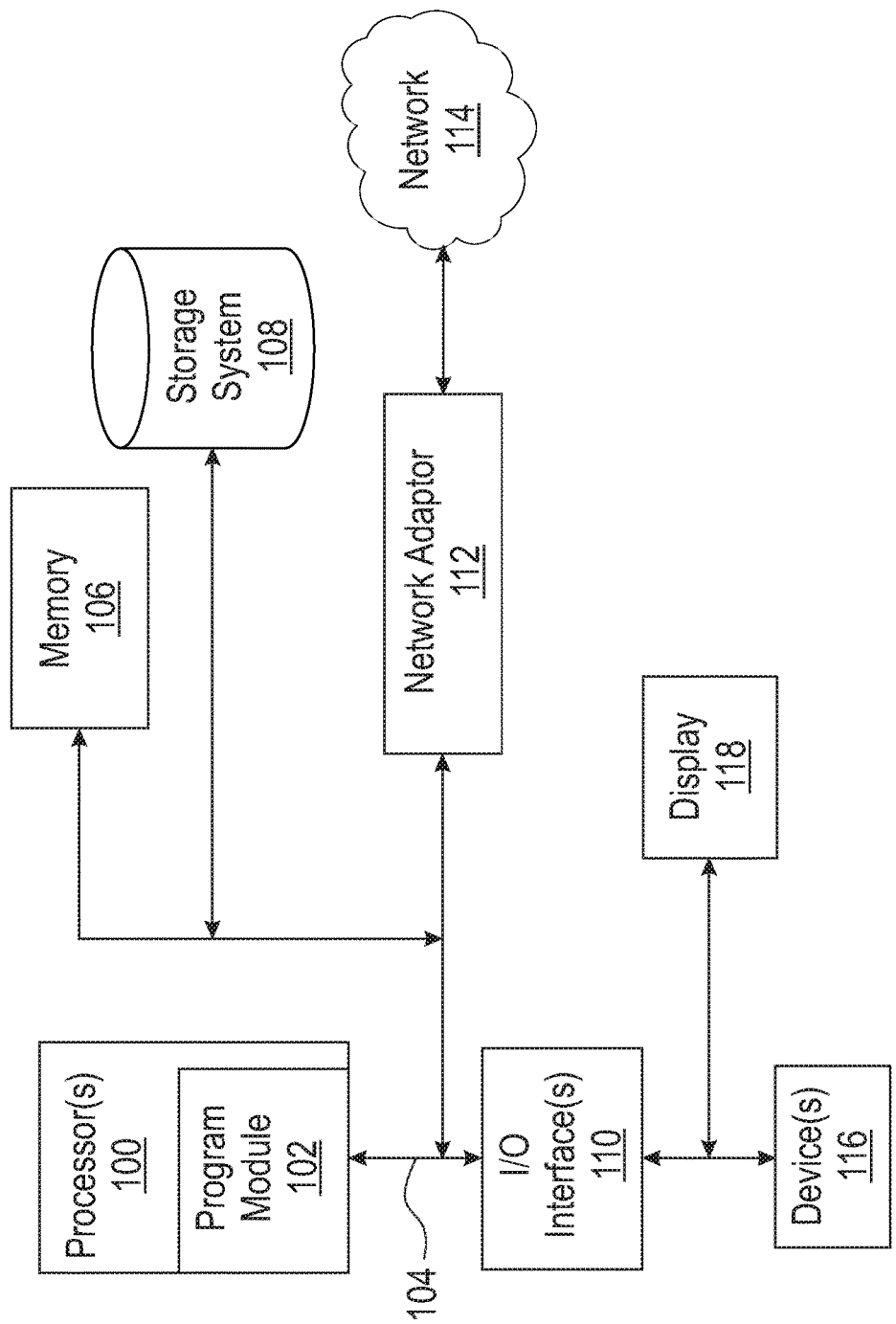
FIG. 13 is an exemplary schematic of a computer or processing system.

FIG. 13 illustrates a schematic of an example computer or processing system that may implement the method of patterning a material layer on a substrate in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 13 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 100, a system memory 106, and a bus 104 that couples various system components including system memory 106 to processor 100. The processor 100 may include a program module 102 that performs the methods described herein. The module 102 may be programmed into the integrated circuits of the processor 100, or loaded from memory 106, storage device 108, or network 114 or combinations thereof.

Bus 104 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 106 can include computer system readable media in the form of volatile memory, such as random access memory (RAM) and/or cache memory or others. Computer system may further include other removable/non-removable, volatile/non-volatile computer system storage media. By way of example only, storage system 108 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 104 by one or more data media interfaces.

Computer system may also communicate with one or more external devices 116 such as a keyboard, a pointing device, a display 118, etc.; one or more devices that enable a user to interact with computer system; and/or any devices (e.g., network card, modem, etc.) that enable computer system to communicate with one or more other computing devices. Such communication can occur via Input/Output (I/O) interfaces 110.

Still yet, computer system can communicate with one or more networks 114 such as a local area network (LAN), a general wide area network (WAN), and/or a public network (e.g., the Internet) via network adapter 112. As depicted, network adapter 112 communicates with the other components of computer system via bus 104. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention may be a system, a method, and/or a computer program product. The computer program product may include a non-transitory computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

In addition, while preferred embodiments of the present invention have been described using specific terms, such description is for illustrative purposes only, and it is to be understood that changes and variations may be made without departing from the spirit or scope of the following claims.

What is claimed is:

1. Method of patterning a material layer on a substrate, the method comprising:
   providing a substrate with a material layer thereupon;
   forming a chemical pattern layer of the material layer according to a material input pattern data, the chemical pattern layer comprising a first material and a second material, wherein one of the first material and the second material comprises an etch-resistant material, on a substrate, wherein physically exposed top surfaces of the first material and physically exposed top surfaces of the second material complementarily overlie an entirety of the substrate, wherein regions in which top surfaces of the first material are physically exposed comprise a prepattern layer, the prepattern layer comprising an alignment-conferring template pattern, wherein the template pattern is formed by the method comprising;
      inputting an input pattern data;
      forming a grating pattern along an X axis of the input pattern data to cover all of the input pattern data;
      subtracting the input pattern data from the grating pattern, to form a conjugate wiring pattern,
      merging adjacent lines of the conjugate wiring pattern in a Y direction of the conjugate wiring pattern that are within a predetermined limit to form a merged conjugate wiring pattern,
      biasing the merged, conjugate wiring pattern in a Y axis direction a predetermined distance from a Y axis edge of the merged, conjugate wiring pattern to create a cut mask pattern,
      subtracting the cut mask pattern from the merged, conjugate wiring pattern to create the template pattern;
   applying a self-assembling material over the template pattern;
   inducing self-alignment of periodically arranged chemically distinct polymeric block components of the self-assembling material to the template pattern, wherein portions of the self-assembling material over the template pattern become self aligned to the template pattern;
   removing one of the polymeric block components selective to the other of the polymeric block components and the etch-resistant material by an etch process to form an etched self-assembled pattern; and
   transferring a pattern into the material layer by an etch process, whereby the material layer is transformed into a patterned material layer containing the transferred pattern.

2. The method of claim 1, further comprising:
   creating a cut mask from the portions of the merged, conjugate wiring pattern that are above the predetermined distance in the Y axis direction;
   applying the cut mask to the patterned material layer;
   exposing the cut mask to an etch process; and
   removing exposed portions of the patterned material layer.

3. The method of claim 1, wherein the predetermine distance from the Y axis edge is about 24 nm to about 40 nm.

4. The method of claim 1, wherein the grating pattern is created by extending each line present in the input line pattern in the Y axis along the length of the X axis and for each line not present in the input line pattern in the Y axis, successively offsetting a present line by a pitch of the self-assembling material in the Y axis direction until all lines in the Y axis direction are filled along the length of the X axis.

5. The method of claim 1, wherein each of the template patterns lines has a thickness below the predetermined distance.

6. The method of claim 1, wherein the template pattern comprises all portions of the conjugate wiring pattern in contact, in the Y axis direction, with one or more empty portions of the conjugate wiring pattern.

7. The method of claim 2, wherein the cut mask pattern consists of portions of the conjugate wiring pattern that are not in contact, in the Y axis direction, with the one or more empty portions of the conjugate wiring pattern.

8. Method of patterning a material layer on a substrate, the method comprising:
   providing a substrate with a material layer thereupon;
   forming a chemical pattern layer of the material layer according to a material input pattern data, the chemical pattern layer comprising a first material and a second material, wherein one of the first material and the second material comprises an etch-resistant material, on a substrate, wherein physically exposed top surfaces of the first material and physically exposed top surfaces of the second material complementarily overlie an entirety of the substrate, wherein regions in which top surfaces of the first material are physically exposed comprise a prepattern layer, the prepattern layer comprising an alignment-conferring, merged template pattern, wherein the merged template pattern is formed by the method comprising;
      inputting an input pattern data;
      forming a grating pattern along an X axis of the input pattern data to cover all of the input pattern data;
      subtracting the input pattern data from the grating pattern, to form a conjugate wiring pattern;
      biasing the conjugate wiring pattern in an X axis direction a distance away from an X axis edge of the input pattern data to form a dummy fill pattern data;
      adding the input pattern data and the dummy fill pattern data;
      subtracting the added input pattern data and the dummy fill pattern data from the grating pattern to form customization template data;
      merging adjacent lines along the X axis in the input pattern data to form the merged the input pattern data;

subtracting the merged input pattern data from the grating pattern, to create a merged data;

merging adjacent lines of the merged data in the Y axis direction to create merged Y data;

removing portions of the merged data of one line width or less in Y to create merged line width Y data;

shifting the merged line width Y data by one line width in the Y axis direction to create shifted, merged Y data;

subtracting the shifted, merged Y data from the merged line width Y data to form alignment-conferring template data; and combining the alignment-conferring template data with the customization template data to create the merged template data;

applying a self-assembling material over the merged template pattern;

inducing self-alignment of periodically arranged chemically distinct polymeric block components of the self-assembling material to the merged template pattern, wherein portions of the self-assembling material over the merged template pattern become self-aligned to the merged template pattern;

removing one of the polymeric block components selective to the other of the polymeric block components and the etch-resistant material by an etch process to form an etched self-assembled pattern; and transferring a pattern into the material layer by an etch process, whereby the material layer is transformed into a patterned material layer containing the transferred pattern.

9. The method of claim 6, wherein the grating pattern is created by extending each line present in the input line pattern in the Y axis along the length of the X axis and for each line not present in the input line pattern in the Y axis, successively offsetting a present line by a pitch of the self-assembling material in the Y axis direction until all lines in the Y axis direction are filled along the length of the X axis.

10. The method of claim 8, wherein at least a portion of the shifted, merged Y data extends along the entire distance in the X axis direction of the alignment-conferring template data.

11. A computer generated method of creating a template pattern, the method comprising:
inputting an input pattern data into a computer, the computer including a non-transitory article of manufacture tangibly embodying computer readable instructions, which when implemented, cause the computer to perform the steps comprising;

forming a grating pattern along an X axis of the input pattern data to cover all of the input pattern data;

subtracting the input pattern data from the grating pattern, to form a conjugate wiring pattern;

merging adjacent lines of the conjugate wiring pattern in a Y direction of the conjugate wiring pattern that are within a predetermined limit to form a merged conjugate wiring pattern; and biasing the merged, conjugate wiring pattern in a Y axis direction a predetermined distance from a Y axis edge of the merged, conjugate wiring pattern to create a cut mask pattern;

subtracting the cut mask pattern from the merged, conjugate wiring pattern to create the template pattern;

providing a substrate with a material layer thereupon;

applying a self-assembling material over the template pattern on the material layer of the substrate.

12. The computer generated method of claim 11, further comprising:
creating a cut mask from the portions of the merged, conjugate wiring pattern that are above the predetermined distance in the Y axis direction;
applying the cut mask to a patterned material layer;
exposing the cut mask to an etch process; and
removing exposed portions of the patterned material layer.

13. The computer generated method of claim 11, wherein the predetermine distance from the Y axis edge is about 24 nm to about 40 nm.

14. The computer generated method of claim 11, wherein the grating pattern is created by extending each line present in the input line pattern in the Y axis along the length of the X axis and for each line not present in the input line pattern in the Y axis, successively offsetting a present line by a pitch of the self-assembling material in the Y axis direction until all lines in the Y axis direction are filled along the length of the X axis.

15. The computer generated method of claim 11, wherein each of the template patterns lines has a thickness below the predetermined distance.

16. The computer generated method of claim 11, wherein the template pattern comprises all portions of the conjugate wiring pattern in contact, in the Y axis direction, with one or more empty portions of the conjugate wiring pattern.

17. The computer generated method of claim 12, wherein the cut mask pattern consists of portions of the conjugate wiring pattern that are not in contact, in the Y axis direction, with the one or more empty portions of the conjugate wiring pattern.

* * * * *